(12) United States Patent
Shin et al.

(10) Patent No.: US 12,074,172 B2
(45) Date of Patent: Aug. 27, 2024

(54) DISPLAY DEVICE

(71) Applicant: Samsung Display Co., LTD., Yongin-si (KR)

(72) Inventors: Dong Hee Shin, Asan-si (KR); Sun Kwun Son, Suwon-si (KR); Na Hyeon Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/085,732

(22) Filed: Dec. 21, 2022

(65) Prior Publication Data

US 2023/0261008 A1    Aug. 17, 2023

(30) Foreign Application Priority Data

Feb. 14, 2022    (KR) .................. 10-2022-0018748

(51) Int. Cl.
*H01L 27/12*     (2006.01)
*G09G 3/3233*    (2016.01)
*H01L 25/16*     (2023.01)

(52) U.S. Cl.
CPC ......... *H01L 27/124* (2013.01); *G09G 3/3233* (2013.01); *G09G 2300/0426* (2013.01); *G09G 2300/0819* (2013.01); *G09G 2300/0842* (2013.01); *G09G 2330/021* (2013.01); *H01L 25/167* (2013.01)

(58) Field of Classification Search
CPC ... G09G 2300/0426; G09G 2300/0819; G09G 2300/0842; G09G 2330/021; G09G 3/3233; H01L 25/167; H01L 27/124; H10K 59/131
See application file for complete search history.

(56) References Cited

U.S. PATENT DOCUMENTS

| | | | |
|---|---|---|---|
| 10,824,259 B2* | 11/2020 | Jin .................. | G06F 3/0412 |
| 2016/0377904 A1* | 12/2016 | Shin .................. | G02F 1/13452 |
| | | | 257/776 |
| 2017/0288008 A1* | 10/2017 | Kim .................. | H10K 77/111 |
| 2018/0188579 A1* | 7/2018 | Jeong .............. | G02F 1/133345 |
| 2019/0296099 A1* | 9/2019 | Lee .................. | H10K 59/1315 |
| 2021/0055615 A1* | 2/2021 | Cheng .............. | G02F 1/13456 |
| 2021/0208433 A1* | 7/2021 | Ahn .................. | G02F 1/134309 |
| 2021/0208463 A1* | 7/2021 | Cha .................. | G09G 3/006 |

(Continued)

FOREIGN PATENT DOCUMENTS

KR    10-2017-0080233    7/2017

OTHER PUBLICATIONS

Extended European Search Report for European Application No. 23156590.4, dated Jun. 5, 2023.

*Primary Examiner* — Kenneth Bukowski
(74) *Attorney, Agent, or Firm* — KILE PARK REED & HOUTTEMAN PLLC

(57) ABSTRACT

A display device comprises a display panel including a display area having a scan area and a power area disposed on a side of the scan area, and a non-display area surrounding the display area and having a pad part. The pad part includes a first pad part including a plurality of line pad parts electrically connected one-to-one to lines of the scan area, and a second pad part including a plurality of line pad parts electrically connected one-to-one to lines of the power area, and a power pad part electrically connected one-to-many to lines of the power area.

22 Claims, 19 Drawing Sheets

(56) References Cited

U.S. PATENT DOCUMENTS

2021/0280641 A1* 9/2021 Bang .................... H10K 50/844
2021/0318583 A1* 10/2021 Shin ...................... G02F 1/1368
2021/0375176 A1   12/2021 Shin et al.

* cited by examiner

DISPLAY DEVICE

CROSS-REFERENCE TO RELATED APPLICATION(S)

This application claims priority to and benefits of Korean Patent Application No. 10-2022-0018748 under 35 U.S.C. § 119, filed on Feb. 14, 2022 in the Korean Intellectual Property Office, the entire contents of which are herein incorporated by reference.

BACKGROUND

1. Technical Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. A display device may be a flat panel display device such as a liquid crystal display device, a field emission display device or an organic light emitting display device. Among the flat panel display devices, in the light emitting display device, since each of the pixels of a display panel may include a light emitting element capable of emitting light by itself, an image can be displayed without a backlight unit providing light to the display panel. The light emitting element may be an organic light emitting diode using an organic material as a fluorescent material or an inorganic light emitting diode using an inorganic material as a fluorescent material.

SUMMARY

Aspects of the disclosure provide a display device capable of securing a process margin by reducing the number of pad parts and increasing an interval between the pad parts.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a display panel including a display area having a scan area and a power area disposed on a side of the scan area, and a non-display area surrounding the display area and having a pad part. The pad part may include a first pad part including a plurality of line pad parts electrically connected one-to-one to lines of the scan area, and a second pad part including a plurality of line pad parts electrically connected one-to-one to lines of the power area, and a power pad part electrically connected one-to-many to lines of the power area.

The scan area may include a vertical gate line electrically connected to the first pad part and extending in a first direction, and a horizontal gate line electrically connected to the vertical gate line and extending in a second direction intersecting the first direction. The power area may include a horizontal gate line electrically connected to a vertical gate line of the scan area.

The power area may include a plurality of power lines extending in parallel in a first direction. A power pad part of the second pad part may be electrically connected to the plurality of power lines.

The plurality of power lines electrically connected to the power pad part may be electrically connected to each other.

The scan area may include a first voltage line extending in a first direction to supply a high potential voltage, and a vertical gate line disposed on a side of the first voltage line to supply a gate signal. The power area may include a first voltage line extending in the first direction to supply a high potential voltage, and a power line disposed on a side of the first voltage line to supply a power voltage.

The display device may further include a first display driver electrically connected to the first pad part to supply a data voltage, a gate signal, and a power voltage to the scan area, and a second display driver electrically connected to the second pad part to supply a data voltage and a power voltage to the power area.

The plurality of line pad parts may have a first width and may be disposed to be spaced apart from each other by a first distance. The power pad part may have a second width greater than the first width.

Power supply efficiency of the power pad part designed in a same area may be greater than power supply efficiency of the plurality of line pad parts.

The scan area may include a plurality of scan areas disposed adjacent to each other. The power area may include a plurality of power areas disposed at edges of the display panel.

The scan area may include a plurality of scan areas, the power area may include a plurality of power areas. A part of the plurality of power areas may be disposed between the plurality of scan areas.

According to an embodiment of the disclosure, a display device may include a display area including a plurality of pixels and having a scan area and a power area disposed on a side of the scan area, and a non-display area surrounding the display area and having a pad part. The scan area may include a first voltage line extending in a first direction on a side of the pixel to supply a high potential voltage, and a plurality of vertical gate lines disposed on a side of the first voltage line to supply a gate signal. The power area may include a first voltage line extending in a first direction on a side of the pixel to supply a high potential voltage, and a plurality of power lines disposed on a side of the first voltage line to supply a power voltage.

The scan area may further include a horizontal gate line electrically connected to the plurality of vertical gate lines and extending in a second direction intersecting the first direction. The power area may further include a horizontal gate line electrically connected to a plurality of vertical gate lines of the scan area.

The pad part may include a first pad part including a plurality of line pad parts electrically connected one-to-one to the first voltage line and the plurality of vertical gate lines, and a second pad part including a line pad part electrically connected one-to-one to the first voltage line, and a power pad part electrically connected one-to-many to the plurality of power lines.

The display device may further include a first display driver electrically connected to the first pad part to supply a data voltage, a gate signal, and a power voltage to the scan area, and a second display driver electrically connected to the second pad part to supply a data voltage and a power voltage to the power area.

The plurality of line pad parts may have a first width and may be disposed to be spaced apart from each other by a first distance. The power pad part may have a second width greater than the first width.

Power supply efficiency of the power pad part designed in a same area may be greater than power supply efficiency of the plurality of line pad parts.

The plurality of power lines electrically connected to the power pad part may be electrically connected to each other.

The plurality of power lines may supply at least one of a driving voltage, a high potential voltage, a low potential voltage, and an off voltage to the power area.

The scan area may include a plurality of scan areas disposed adjacent to each other. The power area may include a plurality of power areas disposed at edges of the display panel.

The scan area may include a plurality of scan areas, the power area may include a plurality of power areas. A part of the plurality of power areas may be disposed between the plurality of scan areas.

According to a display device according to the embodiments, a gate signal may be supplied through a vertical gate line disposed in the scan area, and a power voltage may be supplied through a power line disposed in the power area. Since the power supply efficiency of a power pad part may be similar to the power supply efficiency of the plurality of line pad parts, the display device may reduce the number of line pad parts to supply a power voltage. Accordingly, the display device may secure a process margin by increasing the interval between the pad parts.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
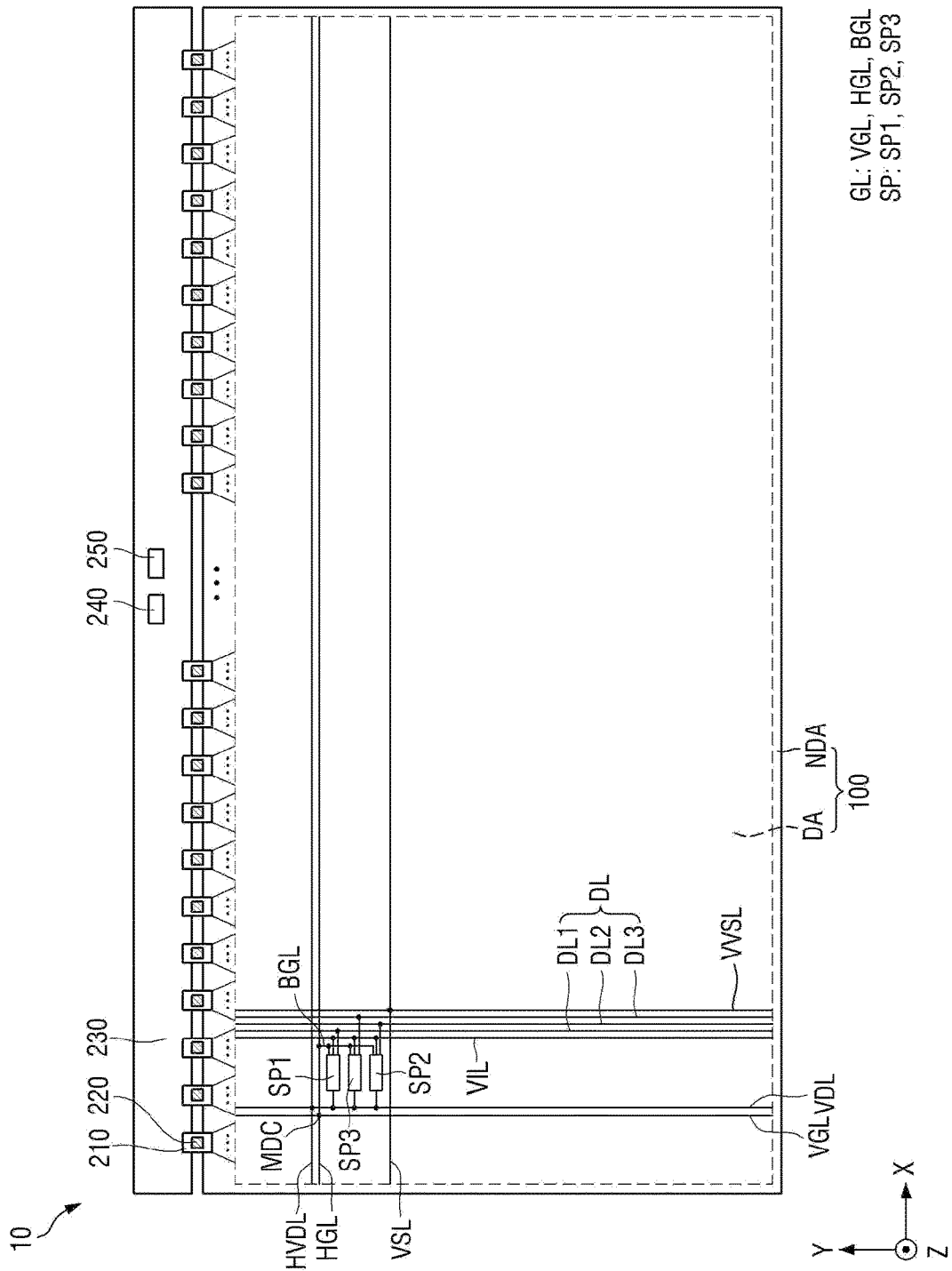
FIG. 1 is a schematic plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more aspects of the disclosure. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the spirit of the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When an element or layer is referred to as being "directly on," "directly connected to," or "directly coupled to" another element or layer, there may be no intervening elements or layers present. The term "connected" may refer to physical, electrical, and/or fluid connection.

Further, the X-axis, the Y-axis, and the Z-axis may not be limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that may not be perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "has," "having," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

FIG. 1 is a schematic plan view illustrating a display device according to an embodiment.

The terms "above," "top" and "top surface" as used herein may refer to an upward direction (i.e., a Z-axis direction) with respect to the display device 10. The terms "below," "bottom" and "bottom surface" as used herein may refer to a downward direction (i.e., a direction opposite to the Z-axis direction) with respect to the display device 10. Further, "left," "right," "upper," and "lower" may indicate directions when the display device 10 is viewed from above. For example, the term "left" may indicate a direction opposite to an X-axis direction, the term "right" may indicate the X-axis direction, the term "upper" may indicate a Y-axis direction, and the term "lower" may indicate a direction opposite to the Y-axis direction.

Referring to FIG. 1, a display device 10, as a device for displaying a moving or still image, may be employed as a display screen of various products such as a television, a laptop computer, a monitor, a billboard, and an Internet of Things (IoT) device as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, and an ultra-mobile PC (UMPC).

The display device 10 may include a display panel 100, a flexible film 210, a display driver 220, a circuit board 230, a timing controller 240, and a power supply unit 250.

The display panel 100 may have a rectangular shape in plan view. For example, the display panel 100 may have a rectangular shape, in plan view, having long sides in a first direction (X-axis direction) and short sides in a second direction (Y-axis direction). A corner formed by the long side in the first direction (X-axis direction) and the short side in the second direction (Y-axis direction) may be right-angled or rounded with a curvature. The planar shape of the display panel 100 is not limited to the rectangular shape, and may be formed in another polygonal shape, a circular shape or an elliptical shape. For example, the display panel 100 may be formed to be flat, but is not limited thereto. In another example, the display panel 100 may be bent with a curvature.

The display panel 100 may include a display area DA and a non-display area NDA.

The display area DA, which may be an area for displaying an image, may be defined as the central area of the display panel 100. The display area DA may include a pixel SP, a gate line GL, a data line DL, an initialization voltage line VIL, a first voltage line VDL, a horizontal voltage line HVDL, and a vertical voltage line VVSL, and a second voltage line VSL. A pixel SP may be formed for each pixel area crossed by data lines DL and gate lines GL. The pixels SP may include first to third pixels SP1, SP2, and SP3. Each of the first to third pixels SP1, SP2, and SP3 may be connected to a horizontal gate line HGL and a data line DL. Each of the first to third pixels SP1, SP2, and SP3 may be defined as a minimum unit area that outputs light.

The first pixel SP1 may emit light of a first color such as red light, the second pixel SP2 may emit light of a second color such as green light, and the third pixel SP3 may emit light of a third color such as blue light. The pixel circuits of the first pixel SP1, the third pixel SP3 and the second pixel SP2 may be arranged in the opposite direction of the second direction (Y-axis direction), but the arrangement direction of the pixel circuits is not limited thereto.

The gate line GL may include the vertical gate line VGL, the horizontal gate line HGL, and an auxiliary gate line BGL.

Vertical gate lines VGL may be connected to a display driver 220 to extend in the second direction (Y-axis direction) and may be spaced apart from each other in the first direction (X-axis direction). The vertical gate line VGL may be a first gate line. The vertical gate lines VGL may be disposed in parallel with the data lines DL. The horizontal gate lines HGL may extend in the first direction (X-axis direction) and may be spaced apart from each other in the second direction (Y-axis direction). The horizontal gate line HGL may be a second gate line. The horizontal gate lines HGL may cross the vertical gate lines VGL. For example, one horizontal gate line HGL may be connected to one of the plurality of vertical gate lines VGL through a contact portion MDC. The contact portion MDC may correspond to a portion in which the horizontal gate line HGL may be inserted into the contact hole and contact the vertical gate line VGL. An auxiliary gate line BGL may extend from the horizontal gate line HGL to supply gate signals to first to third pixels SP1, SP2, and SP3.

The data lines DL may extend in the second direction (Y-axis direction) and may be spaced apart from each other in the first direction (X-axis direction). The data lines DL may include first to third data lines DL1, DL2, and DL3. Each of the first to third data lines DL1, DL2, and DL3 may supply a data voltage to each of the first to third pixels SP1, SP2, and SP3.

The initialization voltage lines VIL may extend in the second direction (Y-axis direction) and may be spaced apart from each other in the first direction (X-axis direction). The initialization voltage line VIL may supply the initialization voltage received from the display driver 220 to the pixel circuit of each of the first to third pixels SP1, SP2 and SP3. The initialization voltage line VIL may receive a sensing signal from the pixel circuit of each of the first to third pixels SP1, SP2 and SP3 to supply the sensing signal the display driver 220.

The first voltage lines VDL may extend in the second direction (Y-axis direction) and may be spaced apart from each other in the first direction (X-axis direction). The first voltage line VDL may supply a driving voltage or a high potential voltage received from a power supply unit 250 to the first to third pixels SP1, SP2, and SP3.

The horizontal voltage lines HVDL may extend in the first direction (X-axis direction) and may be spaced apart from each other in the second direction (Y-axis direction). The horizontal voltage line HVDL may be connected to the first voltage line VDL. The horizontal voltage line HVDL may supply a driving voltage or a high potential voltage to the first voltage line VDL.

The vertical voltage lines VVSL may extend in the second direction (Y-axis direction) and may be spaced apart from each other in the first direction (X-axis direction). The vertical voltage line VVSL may be connected to the second voltage line VSL. The vertical voltage line VVSL may supply the low potential voltage received from the power supply unit 250 to the second voltage line VSL.

The second voltage lines VSL may extend in the first direction (X-axis direction) and may be spaced apart from each other in the second direction (Y-axis direction). The second voltage line VSL may supply a low potential voltage to the first to third pixels SP1, SP2, and SP3.

The connection relationship between the pixel SP, the gate line GL, the data line DL, the initialization voltage line VIL, the first voltage line VDL, and the second voltage line VSL may be changed in design according to the number and arrangement of the pixels SP.

The non-display area NDA may be defined as the remaining area of the display panel 100 except the display area DA. For example, the non-display area NDA may include fan-out lines connecting each of the vertical gate line VGL, the data line DL, the initialization voltage line VIL, the first voltage line VDL, and the vertical voltage line VVSL to the display driver 220, and a pad part connected to the flexible film 210.

Input terminals provided on a side of the flexible film 210 may be attached to the circuit board 230 by a film attaching process, and output terminals provided at another side of the flexible film 210 may be attached to the pad part by the film attaching process. For example, the flexible film 210 may be bent like a tape carrier package or a chip on film. The flexible film 210 may be bent toward the lower portion of the display panel 100 to reduce the bezel area of the display device 10.

The display driver 220 may be mounted on the flexible film 210. For example, the display driver 220 may be implemented as an integrated circuit (IC). The display driver 220 may receive digital video data and a data control signal from the timing controller 240, and according to the data control signal, convert the digital video data to an analog data voltage to supply it to the data lines DL through the fan-out lines. The display driver 220 may generate a gate signal according to a gate control signal supplied from the timing controller 240, and sequentially supply the gate signal to the vertical gate lines VGL in a set order. Accordingly, the display driver 220 may simultaneously function as a data driver and a gate driver. Since the display device 10 may include the display driver 220 disposed on the upper side of the non-display area NDA, sizes of the left side, right side, and lower side of the non-display area NDA may be minimized.

A circuit board 230 may support a timing controller 240 and the power supply unit 250, and supply signals and power to the display driver 220. For example, the circuit board 230 may supply a signal supplied from the timing controller 240 and a power voltage supplied from the power supply unit 250 to the display driver 220 to display an image on each pixel. To this end, a signal transmission line and a power line may be provided on the circuit board 230.

The timing controller 240 may be mounted on the circuit board 230 and receive image data and a timing synchronization signal supplied from the display driving system or a graphic device through a user connector provided on the circuit board 230. The timing controller 240 may generate digital video data by arranging the image data to fit the pixel arrangement structure based on the timing synchronization signal, and may supply the generated digital video data to the display driver 220. The timing controller 240 may generate the data control signal and the gate control signal based on the timing synchronization signal. The timing controller 240 may control the data voltage supply timing of the display driver 220 based on the data control signal, and may control the gate signal supply timing of the display driver 220 based on the gate control signal.

The power supply unit 250 may be disposed on the circuit board 230 to supply a power voltage to the display driver 220 and the display panel 100. For example, the power supply unit 250 may generate a driving voltage or a high potential voltage and supply it to the first voltage line VDL, may generate a low potential voltage and supply it to the vertical voltage line VVSL, and may generate an initialization voltage and supply it to the initialization voltage line VIL.

Figure 2:
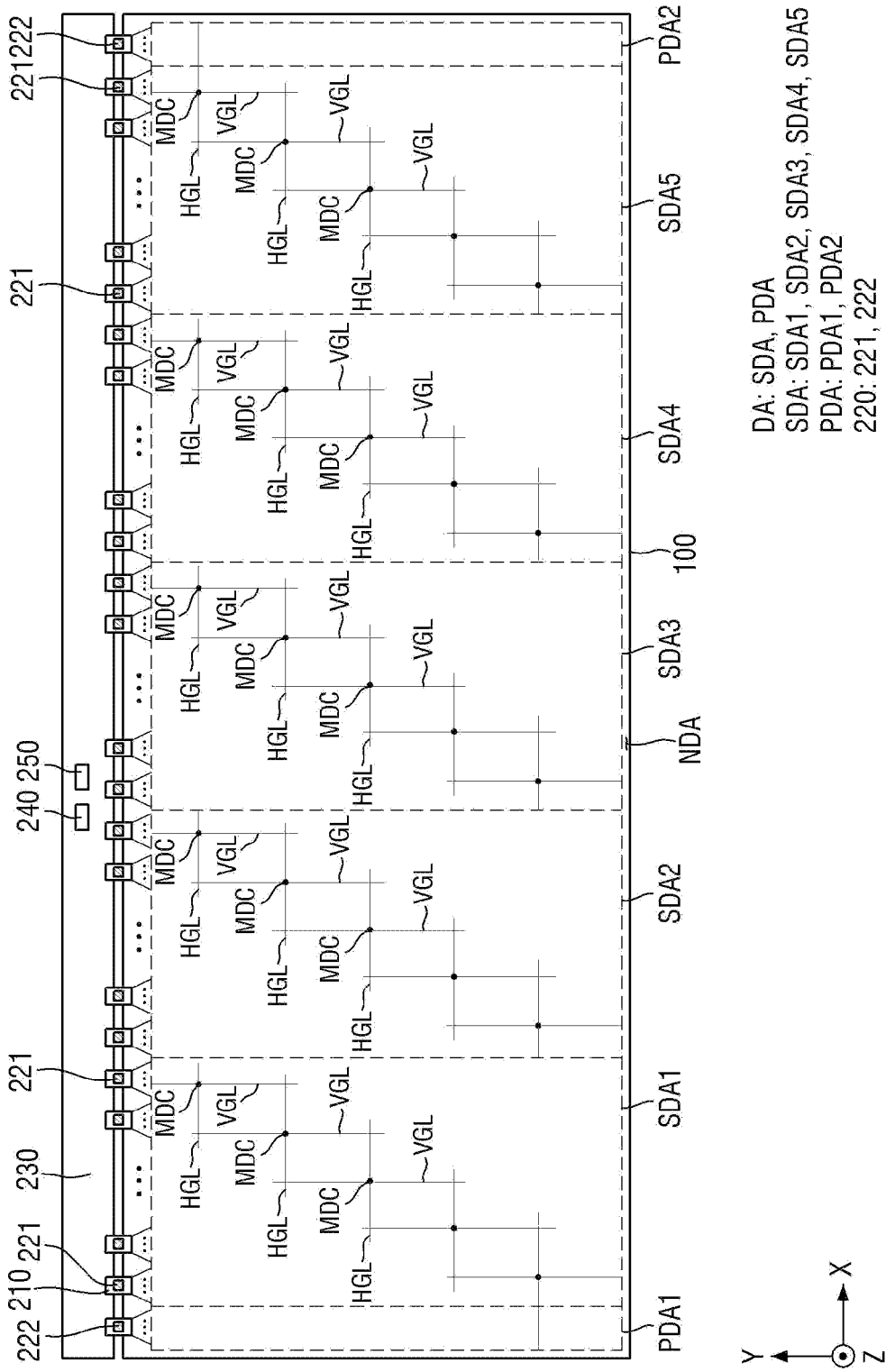
FIG. 2 is a schematic plan view illustrating a contact portion of a vertical gate line and a horizontal gate line in the display device according to an embodiment.
Figure 3:
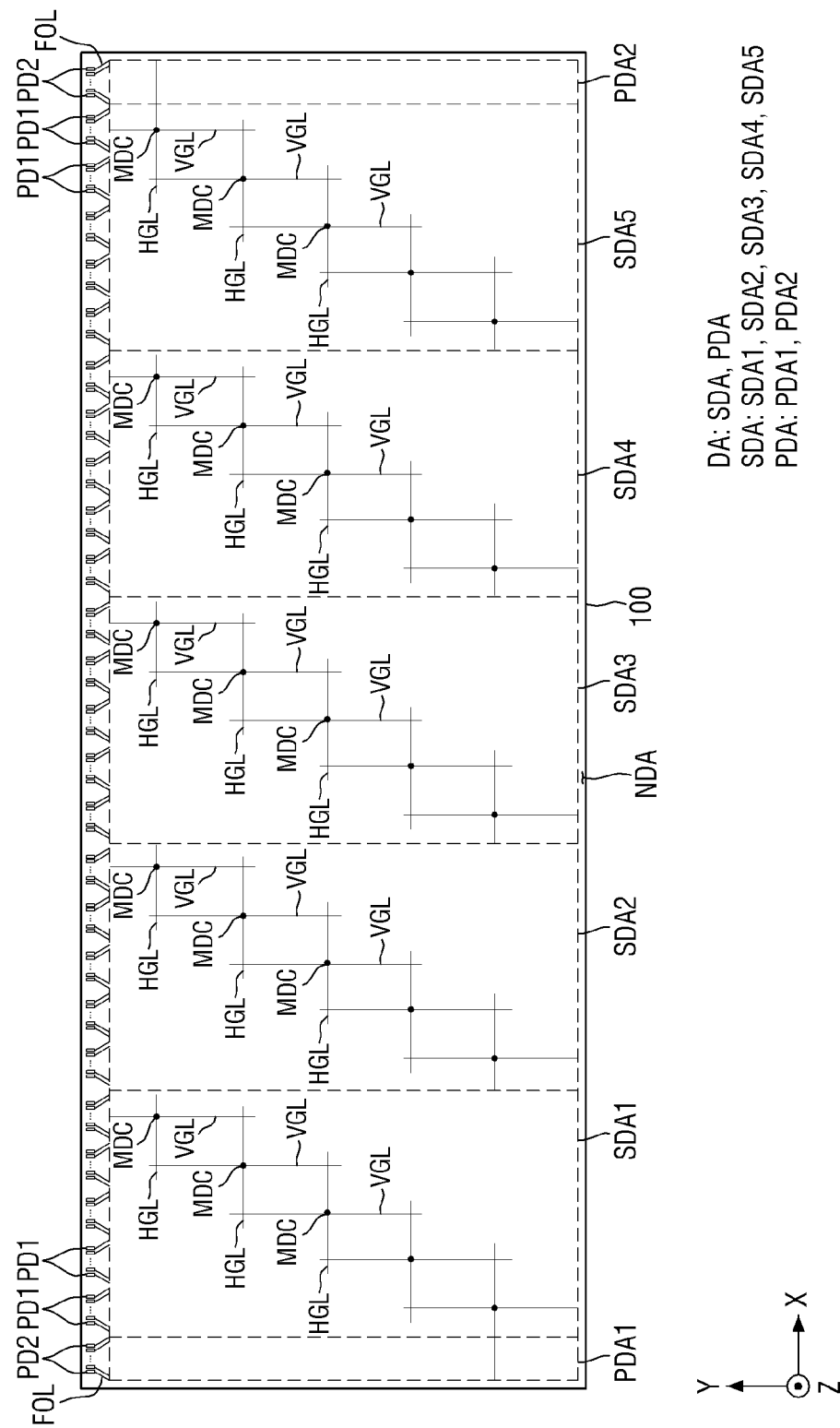
FIG. 3 is a schematic plan view illustrating first and second pad parts in the display device according to an embodiment.

FIG. 2 is a schematic plan view illustrating a contact portion of a vertical gate line and a horizontal gate line in the display device according to an embodiment, and FIG. 3 is a schematic plan view illustrating first and second pad parts in the display device according to an embodiment.

Referring to FIGS. 2 and 3, the display panel 100 may include the display area DA and the non-display area NDA. The display area DA may include a scan area SDA and a power area PDA.

The scan area SDA may include first to fifth scan areas SDA1, SDA2, SDA3, SDA4, and SDA5. The first to fifth scan areas SDA1, SDA2, SDA3, SDA4, and SDA5 may be sequentially disposed in the first direction (X-axis direction). Each of the first to fifth scan areas SDA1, SDA2, SDA3, SDA4, and SDA5 may correspond to a first pad part PD1. Each of the first to fifth scan areas SDA1, SDA2, SDA3, SDA4, and SDA5 may include the vertical gate line VGL and the horizontal gate line HGL.

The vertical gate line VGL may be electrically connected to the first pad part PD1 through a fan-out line FOL. The vertical gate lines VGL may cross the horizontal gate lines HGL. For example, a vertical gate line VGL may be connected to a horizontal gate line HGL through a contact portion MDC. A vertical gate line VGL may be insulated from other horizontal gate lines HGL. Accordingly, the vertical gate line VGL and the horizontal gate line HGL may be insulated from each other at crossing (intersecting) points except for the contact portion MDC.

The contact portion MDC of a first scan area SDA1 may be disposed on an extension line extending from the upper right end of the first scan area SDA1 to the lower left end of the first scan area SDA1. The contact portion MDC of a second scan area SDA2 may be disposed on an extension line extending from the upper right end of the second scan area SDA2 to the lower left end of the second scan area SDA2. The contact portion MDC of a third scan area SDA3 may be disposed on an extension line extending from the upper right end of the third scan area SDA3 to the lower left end of the third scan area SDA3. The contact portion MDC of a fourth scan area SDA4 may be disposed on an extension line extending from the upper right end of the fourth scan area SDA4 to the lower left end of the fourth scan area SDA4. The contact portion MDC of a fifth scan area SDA5 may be disposed on an extension line extending from the upper right end of the fifth scan area SDA5 to the lower left end of the fifth scan area SDA5. Accordingly, the contact portions MDC may be arranged along a diagonal direction between the first direction (X-axis direction) and the second direction (Y-axis direction) in each of the first to fifth display areas SDA1, SDA2, SDA3, SDA4, and SDA5.

The power area PDA may include first and second power areas PDA1 and PDA2. The first and second power areas PDA1 and PDA2 may be disposed at both edges of the display area DA. The first power area PDA1 may be disposed at a left edge of the display area DA. The second power area PDA2 may be disposed at a right edge of the display area DA. The first power area PDA1 may be disposed on the left side of the first scan area SDA1, and the second power area PDA2 may be disposed on the right side of the fifth scan area SDA5. Each of the first and second power areas PDA1 and PDA2 may correspond to a second pad part PD2. Each of the first and second power areas PDA1 and PDA2 may include the horizontal gate line HGL.

The horizontal gate line HGL of the power area PDA may be electrically connected to the vertical gate line VGL of the scan area SDA. The horizontal gate line HGL of the first power area PDA1 may be electrically connected to the vertical gate line VGL of the first scan area SDA1, and the horizontal gate line HGL of the second power area PDA2 may be electrically connected to the vertical gate line VGL of the fifth scan area SDA5.

The display driver 220 may include a first display driver 221 and a second display driver 222. The first display driver 221 may be electrically connected to the first pad part PD1. The first display driver 221 may supply a gate signal to the vertical gate line VGL of the scan area SDA. The first display driver 221 may supply a data voltage to a data line of the scan area SDA and may supply a power voltage to a power line of the scan area SDA. Here, the power voltage may be a driving voltage, a high potential voltage, a low potential voltage, and/or an off voltage. Accordingly, the first display driver 221 may serve as a data driver and a gate driver.

The second display driver 222 may be electrically connected to the second pad part PD2. The second display driver 222 may supply a data voltage to the data line of the power area PDA, and may supply a power voltage to the power line of the power area PDA. Accordingly, the second display driver 222 may serve as a data driver.

Accordingly, since the data line DL receives a data voltage from the first and second display drivers 221 and 222 disposed on the upper side of the non-display area NDA, and the vertical gate line GL receives the gate signal from the first display driver 221 disposed on the upper side of the non-display area NDA, the display device 10 may minimize the sizes of the left side, right side, and lower side of the non-display area NDA.

Figure 4:
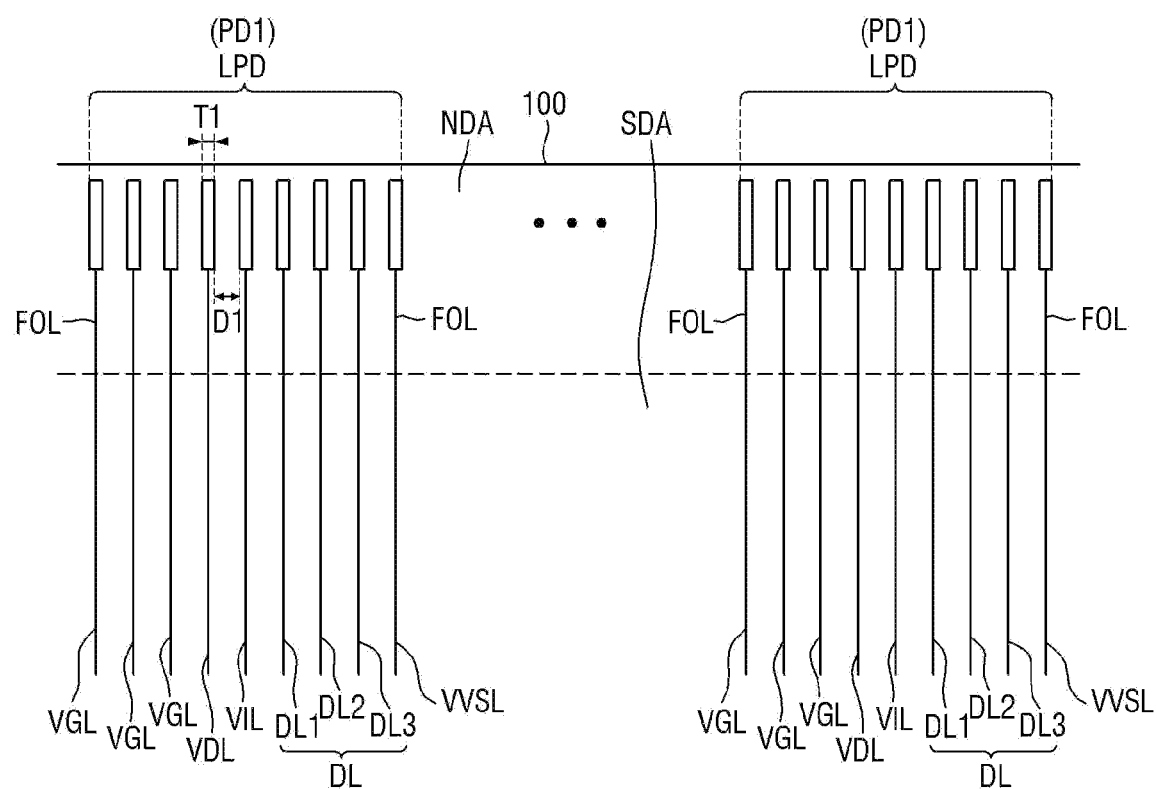
FIG. 4 is a schematic diagram illustrating a connection relationship between a first pad part and lines in a display device according to an embodiment.

FIG. 4 is a schematic diagram illustrating a connection relationship between a first pad part and lines in a display device according to an embodiment.

Referring to FIG. 4, the first pad part PD1 may be electrically connected to the first display driver 221. The first pad part PD1 may include multiple line pad parts LPD. The line pad parts LPD may be connected one-to-one to lines of the scan area SDA. The line pad parts LPD may have substantially the same first width T1 and may be arranged to be spaced apart from each other by a first distance D1. The fan-out line FOL may extend from the first pad part PD1 to the scan area SDA. The first pad part PD1 may be electrically connected to the vertical gate line VGL, the first voltage line VDL, the initialization voltage line VIL, the data line DL, and the vertical voltage line VVSL through the fan-out line FOL. The number of line pad parts LPD may be determined according to the number of lines in the scan area SDA. Accordingly, the first pad part PD1 may supply a signal or voltage received from the first display driver 221 to the pixels SP of the scan area SDA.

Figure 5:
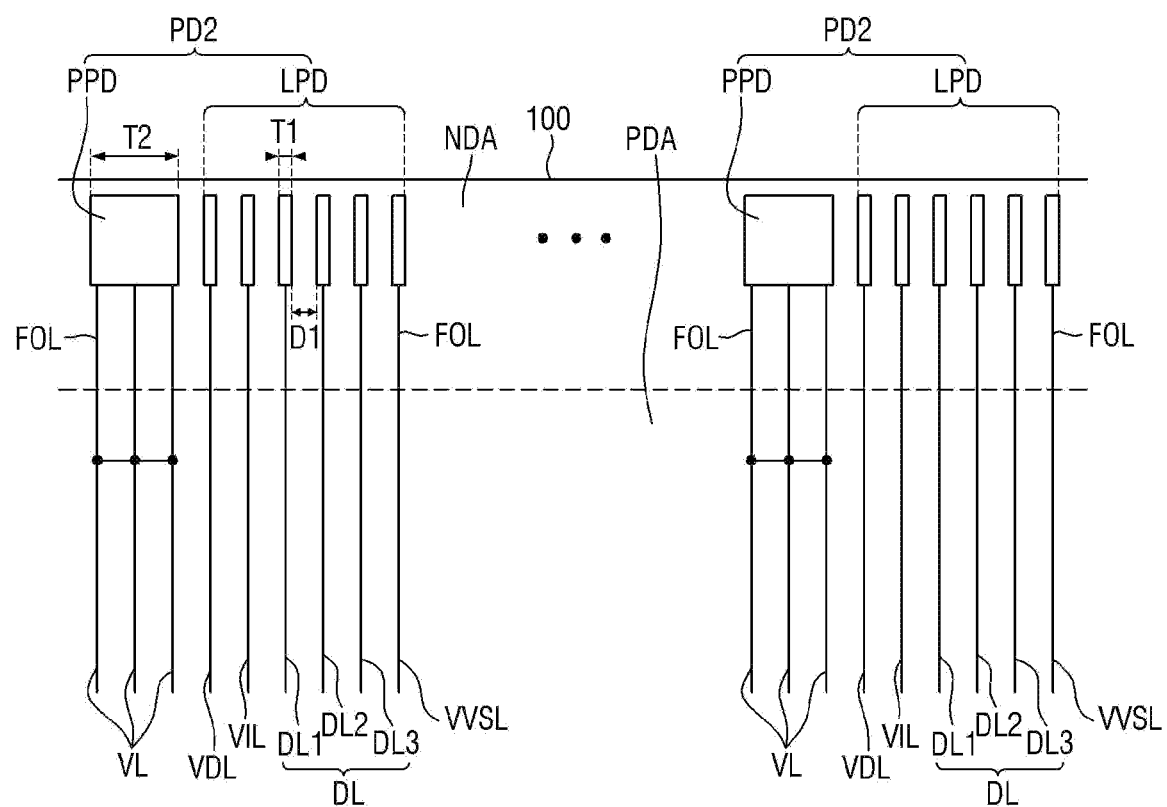
FIG. 5 is a schematic diagram illustrating a connection relationship between a second pad part and lines in a display device according to an embodiment.

FIG. 5 is a schematic diagram illustrating a connection relationship between a second pad part and lines in a display device according to an embodiment.

Referring to FIG. 5, the second pad part PD2 may be electrically connected to the second display driver 222. The second pad part PD2 may include multiple line pad parts LPD and multiple power pad parts PPD. The line pad parts LPD may be connected one-to-one to lines of the power area PDA. The line pad parts LPD may have substantially the same first width T1, and the adjacent line pad parts LPD may be spaced apart from each other by the first distance D1. The power pad part PPD may be connected one-to-many to lines of the power area PDA. A power pad part PPD may be connected to multiple lines in the power area PDA. The power pad parts PPD may have substantially the same second width T2, and the power pad part PPD and line pad part LPD that may be adjacent may be spaced apart from each other by the first distance D1. The second width T2 of a power pad part PPD may be the sum of the first width T1 of the line pad parts LPD and the first distance D1 between the line pad parts LPD.

The second width T2 of a power pad part PPD may be the sum of the first width T1 of the three line pad parts LPD and the first distance D1 between the three line pad parts LPD (T2=3×T1+2×D1). For example, in case that the first width T1 is 15 μm and the first distance D1 is 15 μm, the second width T2 may be 75 μm. The power supply efficiency of the line pad part LPD or the power pad part PPD may be proportional to the area of the line pad part LPD or the power pad part PPD. As the area of the line pad part LPD or the power pad part PPD increases, contact resistance may decrease and power supply efficiency may increase. The power supply efficiency of a power pad part PPD may be similar to the power supply efficiency of the five line pad parts LPD (T2=3×T1+2×D1=5×T1). A power pad part PPD may be disposed on the design area of the three line pad parts LPD, and the power supply efficiency of a power pad part PPD may be greater than the power supply efficiency of the three line pad parts LPD. Accordingly, the power supply efficiency of the power pad part PPD designed in a same area may be greater than the power supply efficiency of the multiple line pad parts LPD. The design of the first width T1, the first distance D1, and the second width T2 may be changed according to the configuration of the display device 10, and is not limited to the example illustrated in FIG. 5.

The fan-out line FOL may extend from the second pad part PD2 to the power area PDA. The power pad part PPD may be electrically connected to the power line VL through the fan-out line FOL. Here, the power line VL may supply a driving voltage, a high potential voltage, a low potential voltage, or an off voltage to the power area PDA. The line pad part LPD may be electrically connected to the first voltage line VDL, the initialization voltage line VIL, the data line DL, and the vertical voltage line VVSL through the fan-out line FOL. The power lines VL may extend in the second direction (Y-axis direction), and may be spaced apart from each other in the first direction (X-axis direction). The adjacent voltage lines VL may be electrically connected. The number of the line pad parts LPD and the power pad parts PPD may be determined according to the number of lines in the power area PDA. Accordingly, the second pad part PD2 may supply a signal or a voltage received from the second display driver 222 to the pixels SP of the power area PDA.

Accordingly, the display device 10 may supply a gate signal through the vertical gate line VGL disposed in the scan area SDA, and may supply a power voltage through the power line VL disposed in the power area PDA. Since the power supply efficiency of a power pad part PPD may be similar to the power supply efficiency of multiple line pad parts LPD, the display device 10 may reduce the number of line pad parts LPD to supply the power voltage. The display device 10 may secure a process margin by increasing the interval between the first pad parts PD1 or the interval between the second pad parts PD2.

Figure 6:
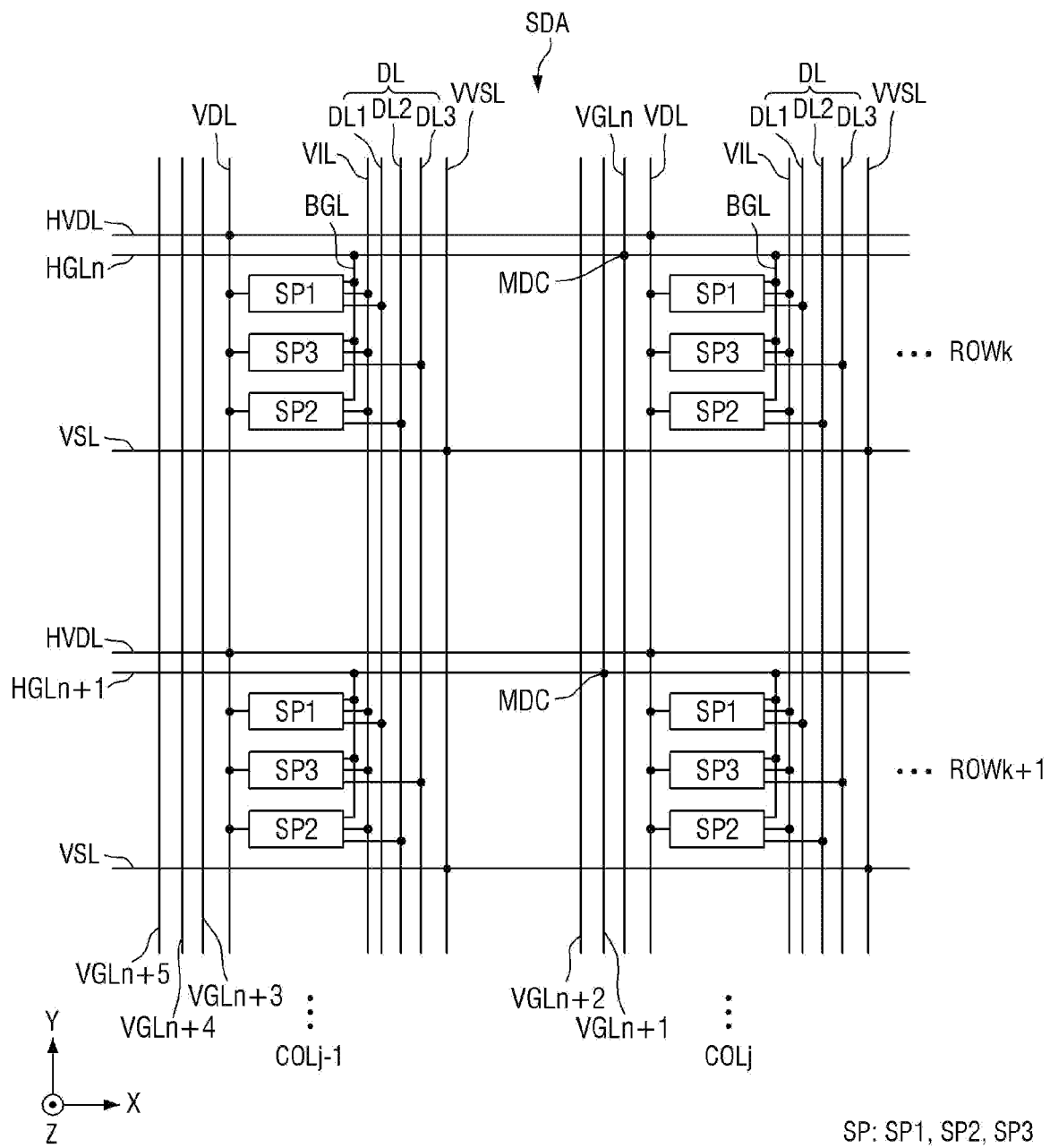
FIG. 6 is a schematic view illustrating pixels and lines of a scan area in a display device according to an embodiment.

FIG. 6 is a schematic view illustrating pixels and lines of a scan area in a display device according to an embodiment.

Referring to FIG. 6, the scan area SDA may include the pixel SP, the vertical gate line VGL, the horizontal gate line HGL, the auxiliary gate line BGL, the first voltage line VDL, the horizontal voltage line HVDL, the initialization voltage line VIL, the data line DL, and the vertical voltage line VVSL. The pixels SP may include first to third pixels SP1, SP2, and SP3. The pixel circuits of the first pixel SP1, the third pixel SP3 and the second pixel SP2 may be arranged in the opposite direction of the second direction (Y-axis direction), but the arrangement direction of the pixel circuits is not limited thereto.

The vertical gate lines VGL may extend in the second direction (Y-axis direction). The vertical gate lines VGL may be disposed on the left side of the first voltage line VDL. The vertical gate lines VGL may be disposed between the vertical voltage line VVSL and the first voltage line VDL. The vertical gate line VGL of the scan area SDA may be connected between the first display driver 221 and the horizontal gate line HGL. The vertical gate lines VGL may cross the horizontal gate lines HGL. The vertical gate line VGL may supply the gate signal received from the first display driver 221 to the horizontal gate line HGL.

For example, the $n^{th}$ vertical gate line VGLn (n being a positive integer), the $(n+1)^{th}$ vertical gate line VGLn+1, and the $(n+2)^{th}$ vertical gate line VGLn+2 may be disposed on the left side of the pixel SP disposed in the $j^{th}$ column COLj (j being an integer greater than or equal to 2). The $n^{th}$, $(n+1)^{th}$, and $(n+2)^{th}$ vertical gate lines VGLn, VGLn+1, and VGLn+2 may be disposed in parallel between the data line DL connected to the pixel SP disposed in the $(M)^{th}$ column COLj−1, and the first voltage line VDL connected to the pixel SP disposed in the $j^{th}$ column COLj. The $(n+3)^{th}$, $(n+4)^{th}$, and $(n+5)^{th}$ vertical gate lines VGLn+3, VGLn+4, and VGLn+5 may be disposed on the left side of the first voltage line VDL connected to the pixel SP disposed in the $(j-1)^{th}$ column COLj−1. The $n^{th}$ vertical gate line VGLn may be connected to the $n^{th}$ horizontal gate line HGLn through the contact portion MDC, and may be insulated from the remaining horizontal gate lines HGL. The $(n+1)^{th}$ vertical gate line VGLn+1 may be connected to the $(n+1)^{th}$ horizontal gate line HGLn+1 through the contact portion MDC, and may be insulated from the remaining horizontal gate lines HGL.

The horizontal gate line HGL may extend in a first direction (X-axis direction). The horizontal gate line HGL may be disposed on the upper side of the pixel circuit of the first pixel SP1. The horizontal gate line HGL may be connected between the vertical gate line VGL and the auxiliary gate line BGL. The horizontal gate line HGL may supply a gate signal received from the vertical gate line VGL to the auxiliary gate line BGL.

For example, the $n^{th}$ horizontal gate line HGLn may be disposed on the upper side of the pixel circuit of the first pixel SP1 disposed in the $k^{th}$ row ROWk (k being a positive integer. The $n^{th}$ horizontal gate line HGLn may be connected to the $n^{th}$ vertical gate line VGLn through the contact portion MDC and may be insulated from the remaining vertical gate lines VGL. The $(n+1)^{th}$ horizontal gate line HGLn+1 may be disposed on the upper side of the pixel circuit of the first pixel SP1 disposed in the $(k+1)^{th}$ row ROWk+1. The $(n+1)^{th}$ horizontal gate line HGLn+1 may be connected to the $(n+1)^{th}$ vertical gate line VGLn+1 through the contact portion MDC, and may be insulated from the remaining vertical gate lines VGL.

The auxiliary gate line BGL may extend from the horizontal gate line HGL in the opposite direction of the second direction (Y-axis direction). The auxiliary gate line BGL may be disposed on the right side of the pixel circuits of the first to third pixels SP1, SP2 and SP3. The auxiliary gate line BGL may supply the gate signals received from the horizontal gate line HGL to the pixel circuits of the first to third pixels SP1, SP2 and SP3.

A first voltage line VDL may extend in the second direction (Y-axis direction). The first voltage line VDL may be disposed on the left side of the pixel circuits of the first to third pixels SP1, SP2 and SP3. The first voltage line VDL may supply a driving voltage or high potential voltage to a transistor of each of the first to third pixels SP1, SP2 and SP3.

The horizontal voltage line HVDL may extend in the first direction (X-axis direction). The horizontal voltage line HVDL may be disposed on the upper side of the horizontal gate line HGL. For example, the horizontal voltage line HVDL may be disposed on the upper side of the $n^{th}$ horizontal gate line HGLn or the $(n+1)^{th}$ horizontal gate line HGLn+1. The horizontal voltage line HVDL may be connected to the first voltage line VDL. The horizontal voltage line HVDL may supply a driving voltage or a high potential voltage to the first voltage line VDL.

The initialization voltage line VIL may extend in the second direction (Y-axis direction). The initialization voltage line VIL may be disposed on the right side of the auxiliary gate line BGL. The initialization voltage line VIL may be disposed between the auxiliary gate line BGL and the data line DL. The initialization voltage line VIL may supply an initialization voltage to the pixel circuit of each of the first to third pixels SP1, SP2, and SP3. The initialization voltage line VIL may receive a sensing signal from the pixel circuit of each of the first to third pixels SP1, SP2 and SP3 to supply the sensing signal the first display driver 221.

A plurality of data lines DL may extend in the second direction (Y-axis direction). The plurality of data lines DL may supply a data voltage to the first to third pixels SP1, SP2, and SP3. The plurality of data lines DL may include first to third data lines DL1, DL2, and DL3.

The first data line DL1 may extend in the second direction (Y-axis direction). The first data line DL1 may be disposed on the right side of the initialization voltage line VIL. The first data line DL1 may supply the data voltage received from the first display driver 221 to the pixel circuit of the first pixel SP1.

The second data line DL2 may extend in the second direction (Y-axis direction). The second data line DL2 may be disposed on the right side of the first data line DL1. The second data line DL2 may supply the data voltage received from the first display driver 221 to the pixel circuit of the second pixel SP2.

The third data line DL3 may extend in the second direction (Y-axis direction). The third data line DL3 may be disposed on the right side of the second data line DL2. The third data line DL3 may supply the data voltage received from the first display driver 221 to the pixel circuit of the third pixel SP3.

The vertical voltage line VVSL may extend in the second direction (Y-axis direction). The vertical voltage line VVSL may be disposed on the right side of the third data line DL3. The vertical voltage line VVSL may be connected between the power supply unit 250 and the second voltage line VSL. The vertical voltage line VVSL may supply the low potential voltage supplied from the power supply unit 250 to the second voltage line VSL.

The second voltage line VSL may extend in the first direction (X-axis direction). The second voltage line VSL may be disposed on the lower side of the pixel circuit of the second pixel SP2. The second voltage line VSL may supply the low potential voltage received from the vertical voltage line VVSL to a light emitting element layer of the first to third pixels SP1, SP2, and SP3.

Figure 7:
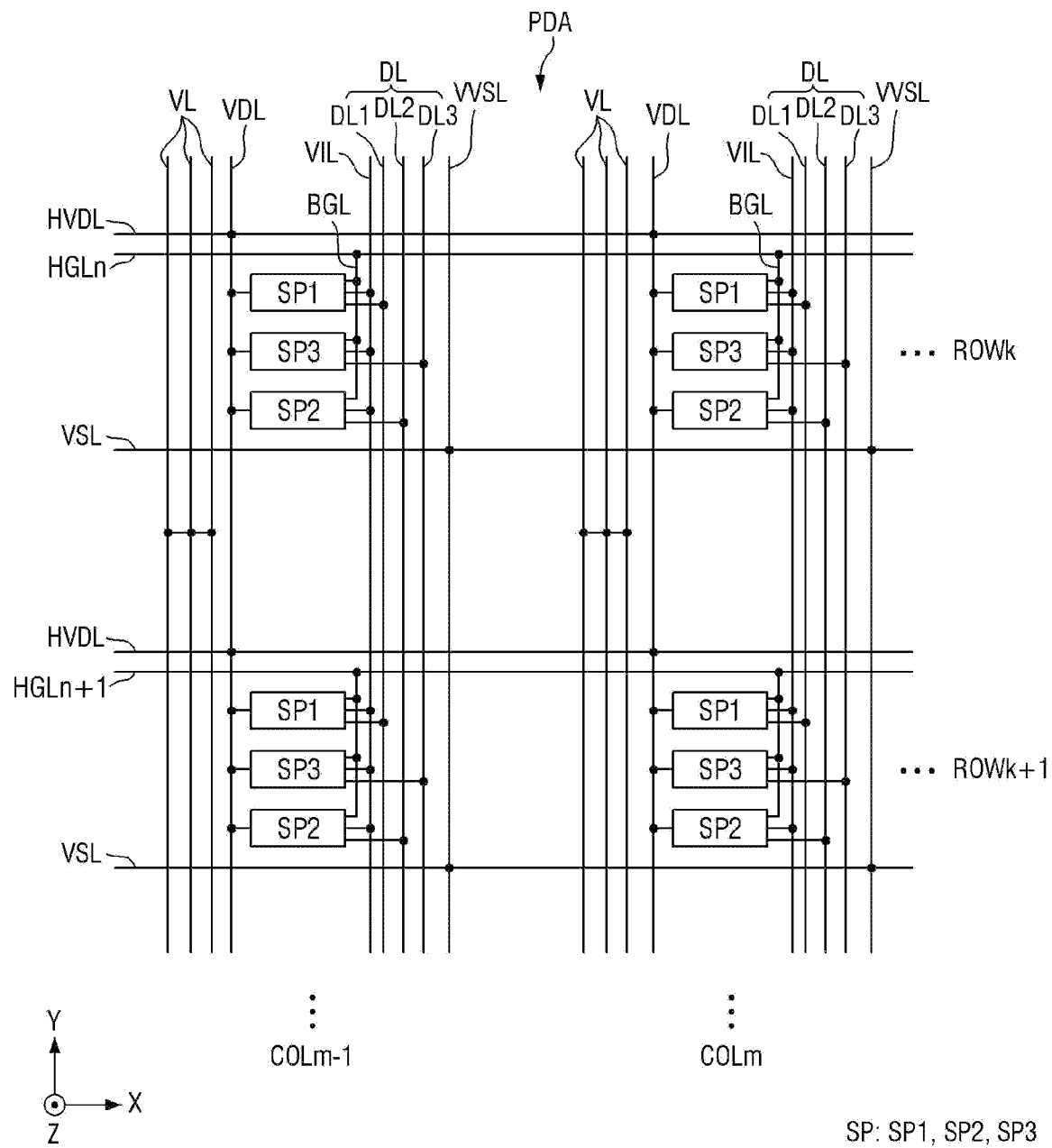
FIG. 7 is a schematic view illustrating pixels and lines in a power area in a display device according to an embodiment.

FIG. 7 is a schematic view illustrating pixels and lines in a power area in a display device according to an embodiment.

Referring to FIG. 7, the power area PDA may include the pixel SP, the power line VL, the horizontal gate line HGL, the auxiliary gate line BGL, the first voltage line VDL, the horizontal voltage line HVDL, the initialization voltage line VIL, the data line DL, and the vertical voltage line VVSL. The pixels SP may include first to third pixels SP1, SP2, and SP3. The pixel circuits of the first pixel SP1, the third pixel SP3 and the second pixel SP2 may be arranged in the opposite direction of the second direction (Y-axis direction), but the arrangement direction of the pixel circuits is not limited thereto.

Power lines VL may extend in the second direction (Y-axis direction). The power lines VL may be disposed on the left side of the first voltage line VDL. The power lines VL may be disposed between the vertical voltage line VVSL and the first voltage line VDL. The power line VL may supply a driving voltage, a high potential voltage, a low potential voltage, or an off voltage to the power area PDA. The adjacent voltage lines VL may be electrically connected. For example, the power lines VL may be disposed on the left side of the pixel SP disposed in the $m^{th}$ column COLm (m being an integer greater than or equal to 2). The power lines VL may be disposed in parallel between the data line DL connected to the pixel SP disposed in the $(m-1)^{th}$ column COLm−1, and the first voltage line VDL connected to the pixel SP disposed in the $m^{th}$ column COLm. The power lines VL may be disposed on the left side of the first voltage line VDL connected to the pixel SP disposed in the $(m-1)^{th}$ column COLm−1.

The horizontal gate line HGL may extend in a first direction (X-axis direction). The horizontal gate line HGL may be disposed on the upper side of the pixel circuit of the first pixel SP1. The horizontal gate line HGL of the scan area SDA may extend to the power area PDA. The horizontal gate line HGL of the power area PDA may supply the gate signal received from the vertical gate line VGL of the scan area SDA to the auxiliary gate line BGL. For example, the $n^{th}$ horizontal gate line HGLn may be disposed on the upper side of the pixel circuit of the first pixel SP1 disposed in the $k^{th}$ row ROWk (k being a positive integer. The $(n+1)^{th}$ horizontal gate line HGLn+1 may be disposed on the upper side of the pixel circuit of the first pixel SP1 disposed in the $(k+1)^{th}$ row ROWk+1.

The auxiliary gate line BGL may extend from the horizontal gate line HGL in the opposite direction of the second direction (Y-axis direction). The auxiliary gate line BGL may be disposed on the right side of the pixel circuits of the first to third pixels SP1, SP2 and SP3. The auxiliary gate line BGL may supply the gate signals received from the horizontal gate line HGL to the pixel circuits of the first to third pixels SP1, SP2 and SP3.

A first voltage line VDL may extend in the second direction (Y-axis direction). The first voltage line VDL may be disposed on the left side of the pixel circuits of the first to third pixels SP1, SP2 and SP3. The first voltage line VDL may supply a driving voltage or high potential voltage to a transistor of each of the first to third pixels SP1, SP2 and SP3.

The horizontal voltage line HVDL may extend in the first direction (X-axis direction). The horizontal voltage line HVDL may be disposed on the upper side of the horizontal gate line HGL. For example, the horizontal voltage line HVDL may be disposed on the upper side of the $n^{th}$ horizontal gate line HGLn or the $(n+1)^{th}$ horizontal gate line HGLn+1. The horizontal voltage line HVDL may be connected to the first voltage line VDL. The horizontal voltage line HVDL may supply a driving voltage or a high potential voltage to the first voltage line VDL.

The initialization voltage line VIL may extend in the second direction (Y-axis direction). The initialization voltage line VIL may be disposed on the right side of the auxiliary gate line BGL. The initialization voltage line VIL may be disposed between the auxiliary gate line BGL and the data line DL. The initialization voltage line VIL may supply an initialization voltage to the pixel circuit of each of the first to third pixels SP1, SP2, and SP3. The initialization voltage line VIL may receive a sensing signal from the pixel circuit of each of the first to third pixels SP1, SP2 and SP3 to supply the sensing signal the second display driver 222.

Data lines DL may extend in the second direction (Y-axis direction). The data lines DL may supply a data voltage to the first to third pixels SP1, SP2, and SP3. The data lines DL may include first to third data lines DL1, DL2, and DL3.

The first data line DL1 may extend in the second direction (Y-axis direction). The first data line DL1 may be disposed on the right side of the initialization voltage line VIL. The first data line DL1 may supply the data voltage received from the second display driver 222 to the pixel circuit of the first pixel SP1.

The second data line DL2 may extend in the second direction (Y-axis direction). The second data line DL2 may be disposed on the right side of the first data line DL1. The second data line DL2 may supply the data voltage received from the second display driver 222 to the pixel circuit of the second pixel SP2.

The third data line DL3 may extend in the second direction (Y-axis direction). The third data line DL3 may be disposed on the right side of the second data line DL2. The third data line DL3 may supply the data voltage received from the second display driver 222 to the pixel circuit of the third pixel SP3.

The vertical voltage line VVSL may extend in the second direction (Y-axis direction). The vertical voltage line VVSL may be disposed on the right side of the third data line DL3. The vertical voltage line VVSL may be connected between the power supply unit 250 and the second voltage line VSL. The vertical voltage line VVSL may supply the low potential voltage supplied from the power supply unit 250 to the second voltage line VSL.

The second voltage line VSL may extend in the first direction (X-axis direction). The second voltage line VSL may be disposed on the lower side of the pixel circuit of the second pixel SP2. The second voltage line VSL may supply the low potential voltage received from the vertical voltage line VVSL to a light emitting element layer of the first to third pixels SP1, SP2, and SP3.

Figure 8:
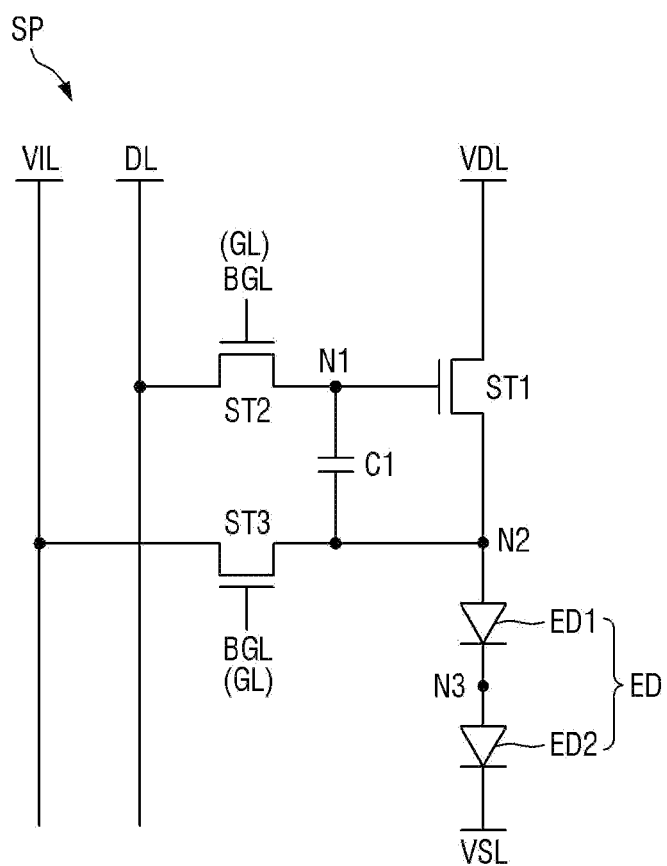
FIG. 8 is a schematic circuit diagram illustrating a pixel of a display device according to an embodiment.

FIG. 8 is a schematic circuit diagram illustrating a pixel of a display device according to an embodiment.

Referring to FIG. 8, the pixels SP may include first to third pixels SP1, SP2, and SP3. Each of the first to third pixels SP1, SP2, and SP3 may be connected to the first voltage line VDL, the data line DL, the initialization voltage line VIL, the auxiliary gate line BGL, and the second voltage line VSL.

Each of the first to third pixels SP1, SP2, and SP3 may include first to third transistors ST1, ST2, and ST3, a first capacitor C1, and light emitting elements ED.

The first transistor ST1 may include a gate electrode, a drain electrode, and a source electrode. The gate electrode of the first transistor ST1 may be connected to a first node N1, the drain electrode thereof may be connected to the first voltage line VDL, and the source electrode thereof may be connected to a second node N2. The first transistor ST1 may control a drain-source current (or driving current) based on a data voltage applied to the gate electrode.

The light emitting elements ED may include a first light emitting element ED1 and a second light emitting element ED2. The first and second light emitting elements ED1 and ED2 may be connected in series. The first and second light emitting elements ED1 and ED2 may receive a driving current to emit light. The light emission amount or the luminance of the light emitting element ED may be proportional to the magnitude of the driving current. For example, the light emitting element ED may be an inorganic light emitting element including an inorganic semiconductor, but is not limited thereto. As another example, the light emitting element ED may be a quantum dot light emitting diode including a quantum dot light emitting layer, an organic light emitting diode including an organic light emitting layer, or an ultra-small light emitting diode. The configuration of the light emitting element layer of the display device 10 may be changed in design according to the type of the light emitting element ED.

The first electrode of the first light emitting element ED1 may be connected to the second node N2, and the second electrode of the first light emitting element ED1 may be connected to a third node N3. The first electrode of the first light emitting element ED1 may be connected to the source electrode of the first transistor ST1, the drain electrode of the third transistor ST3 and a second capacitor electrode of the first capacitor C1 through the second node N2. The second electrode of the first light emitting element ED1 may be connected to the first electrode of the second light emitting element ED2 through the third node N3.

The first electrode of the second light emitting element ED2 may be connected to the third node N3 and the second electrode of the second light emitting element ED2 may be connected to the second voltage line VSL. The first electrode of the second light emitting element ED2 may be connected to the second electrode of the first light emitting element ED1 through the third node N3.

The second transistor ST2 may be turned on by the gate signal of the gate line GL or the auxiliary gate line BGL to electrically connect the data line DL to the first node N1 which may be the gate electrode of the first transistor ST1. The second transistor ST2 may be turned on according to the gate signal to supply the data voltage to the first node N1. The gate electrode of the second transistor ST2 may be connected to the auxiliary gate line BGL, the drain electrode thereof may be connected to the data line DL, and the source electrode thereof may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by the gate signal of the auxiliary gate line BGL or the gate line GL to electrically connect the initialization voltage line VIL to the second node N2 that may be the source electrode of the first transistor ST1. The third transistor ST3 may be turned on according to the gate signal to supply the initialization voltage to the second node N2. A gate electrode of the third transistor ST3 may be connected to the auxiliary gate line BGL, a drain electrode may be connected to the second node N2, and a source electrode may be connected to the initialization voltage line VIL. The drain electrode of the third transistor ST3 may be connected to the source electrode of the first transistor ST1, the second capacitor electrode of the first capacitor C1 and the first electrode of the first light emitting element ED1 through the second node N2.

Figure 9:
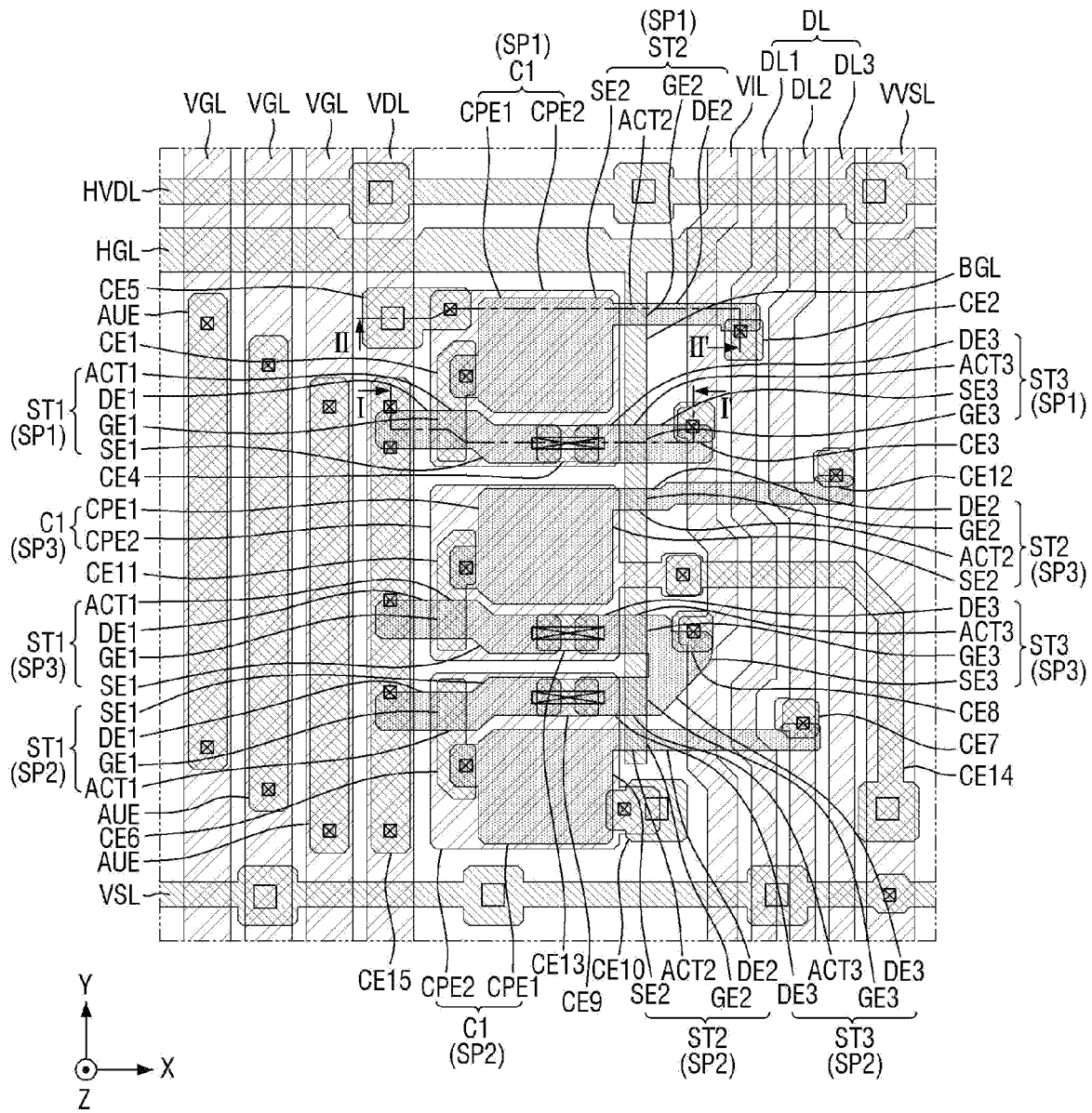
FIGS. 9 and 10 are schematic plan views illustrating a part of a scan area in a display device according to an embodiment.
Figure 10:
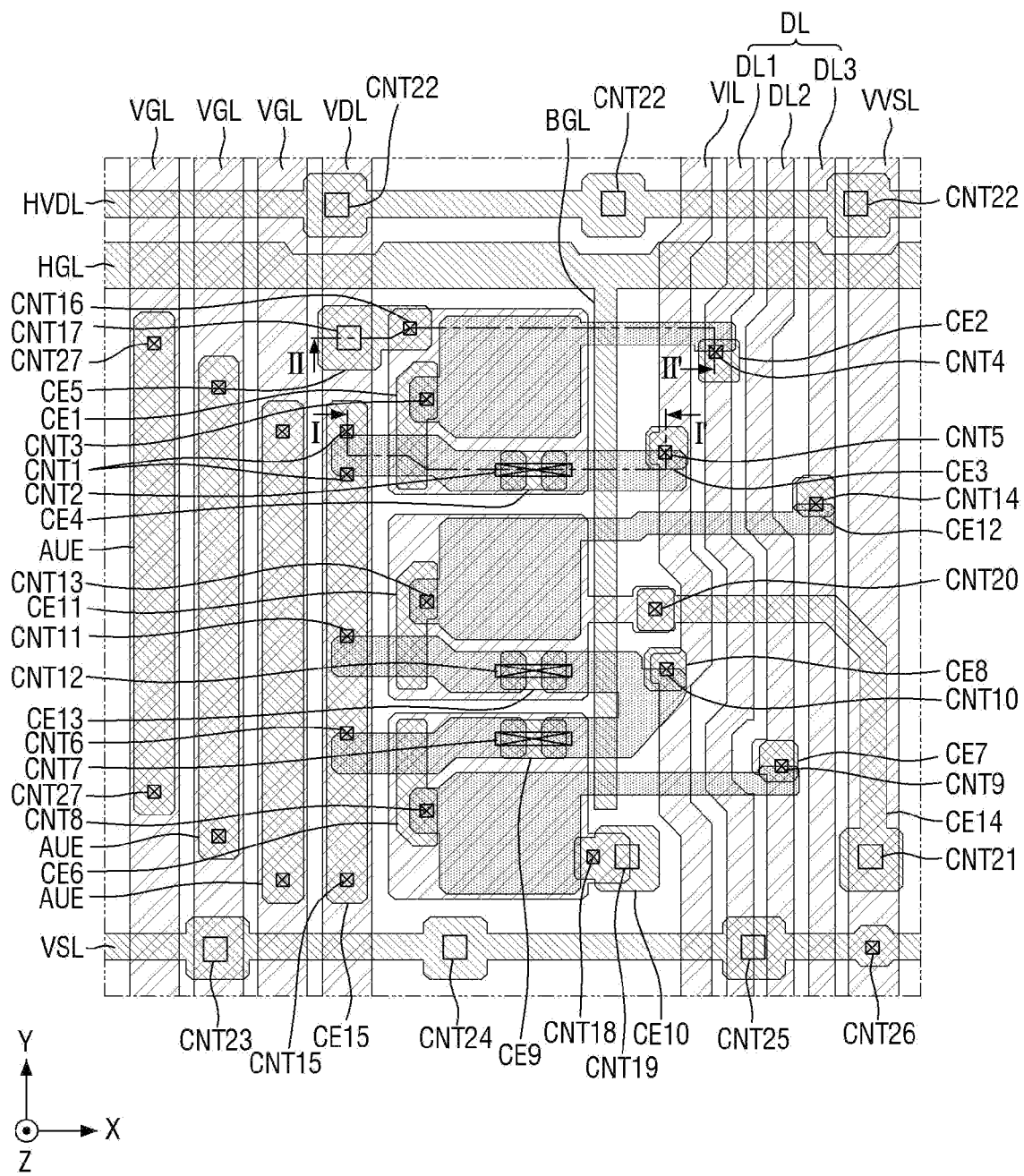
Figure 11:
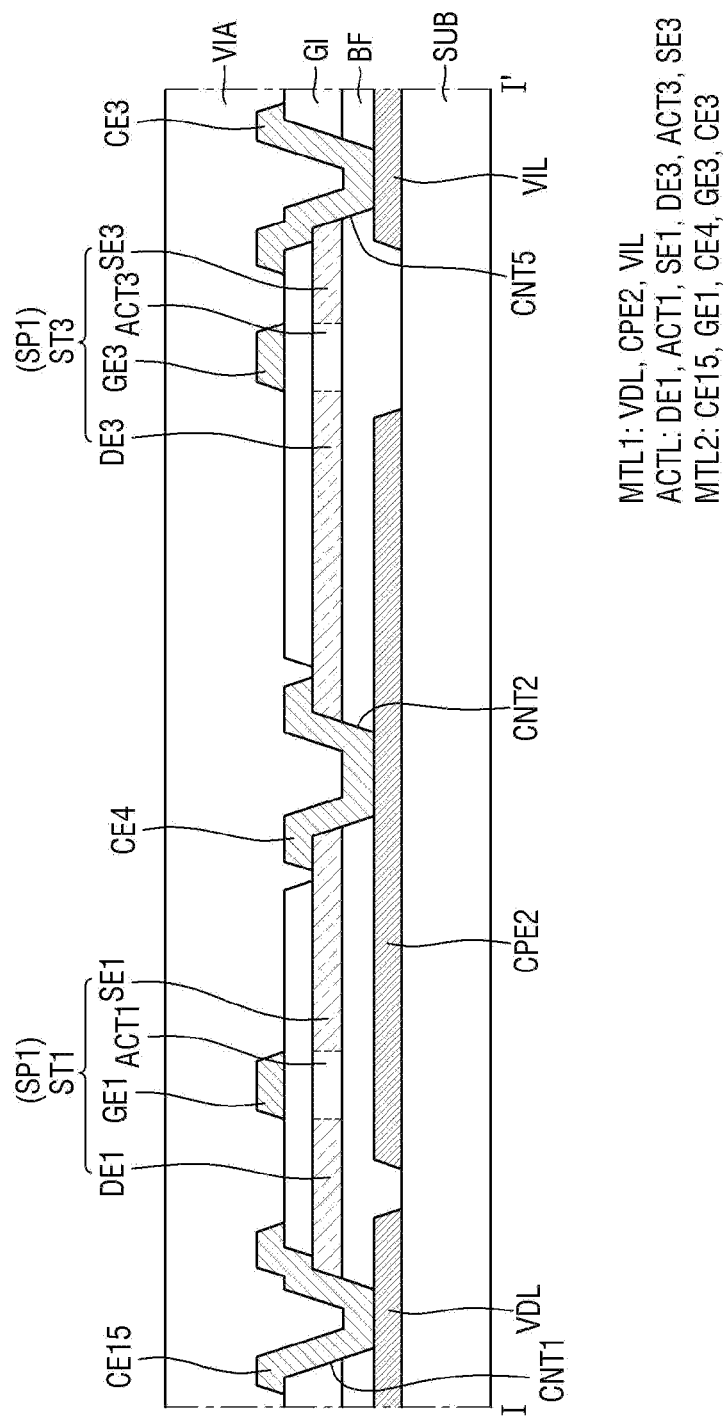
FIG. 11 is a schematic cross-sectional view taken along line I-I' of FIGS. 9 and 10.
Figure 12:
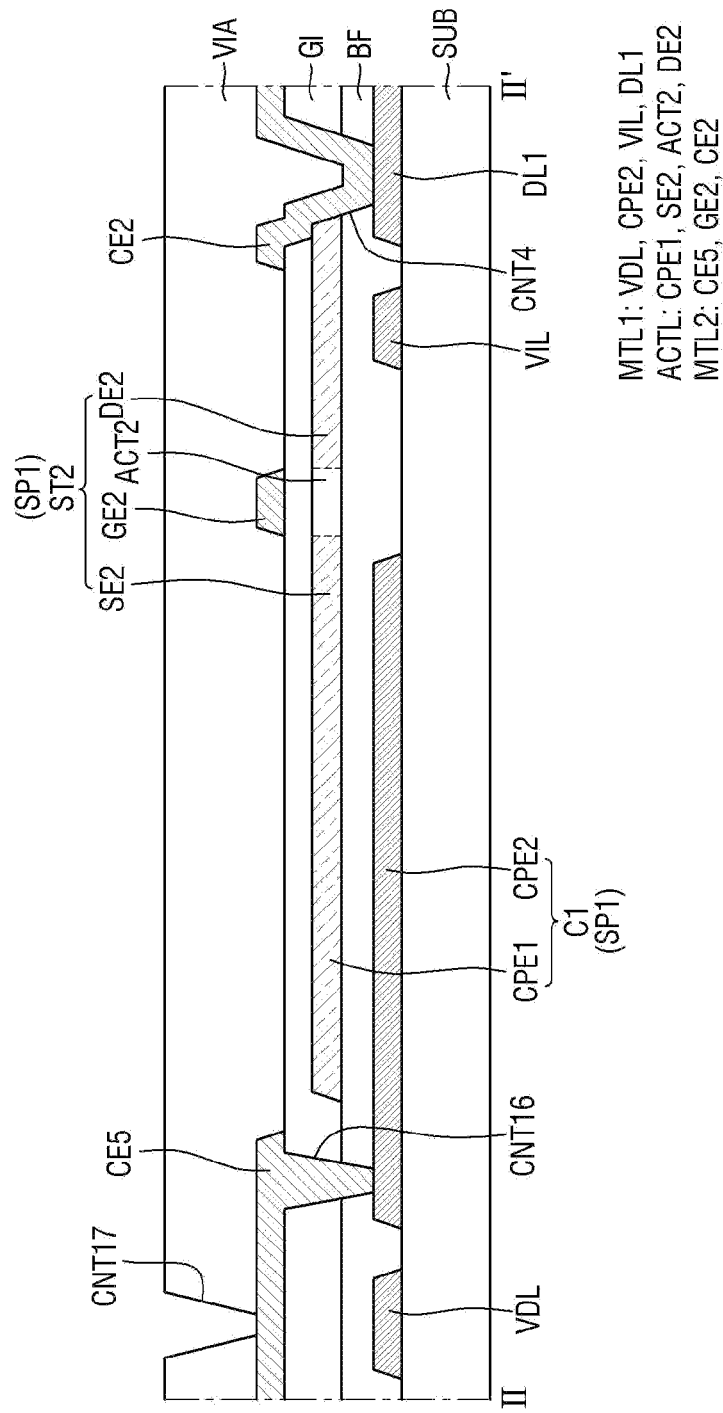
FIG. 12 is a schematic cross-sectional view taken along line II-II' of FIGS. 9 and 10.

FIGS. 9 and 10 are schematic plan views illustrating a part of a scan area in a display device according to an embodiment. FIG. 11 is a schematic cross-sectional view taken along line I-I' of FIGS. 9 and 10, and FIG. 12 is a schematic cross-sectional view taken along line II-II' of FIGS. 9 and 10.

Referring to FIGS. 9 to 12, the pixels SP may include first to third pixels SP1, SP2, and SP3. The pixel circuit of the first pixel SP1, the pixel circuit of the third pixel SP3 and the pixel circuit of the second pixel SP2 may be arranged in the opposite direction of the second direction (Y-axis direction). A pixel circuit of each of the first to third pixels SP1, SP2, and SP3 may be disposed in a pixel area.

The first voltage line VDL may be disposed on a first metal layer MTL1 on the substrate SUB. The first voltage line VDL may be disposed on the left side of the pixel circuits of the first to third pixels SP1, SP2 and SP3. The first voltage line VDL may overlap a fifteenth connection electrode CE15 of a second metal layer MTL2 in the thickness direction (Z-axis direction). The first voltage line VDL may be connected to the fifteenth connection electrode CE15 through a fifteenth contact hole CNT15. The fifteenth connection electrode CE15 may be connected to a drain electrode DE1 of the first transistor ST1 of the first pixel SP1 through a first contact hole CNT1, may be connected to the drain electrode DE1 of the first transistor ST1 of the second pixel SP2 through a sixth contact hole CNT6, and may be connected to the drain electrode DE1 of the first transistor ST1 of the third pixel SP3 through an eleventh contact hole CNT11. Accordingly, the first voltage line VDL may supply a driving voltage to the first to third pixels SP1, SP2, and SP3 through the fifteenth connection electrode CE15.

The horizontal voltage line HVDL may be disposed on the second metal layer MTL2. The second metal layer MTL2 may be disposed on a gate insulating layer GI covering an active layer ACTL. The horizontal voltage line HVDL may be disposed on the upper side of the horizontal gate line HGL. The horizontal voltage line HVDL may be connected to the first voltage lines VDL to receive a driving voltage. The horizontal voltage line HVDL may stably maintain the driving voltage or the high potential voltage of the first voltage lines VDL.

The initialization voltage line VIL may be disposed on the first metal layer MTL1. The initialization voltage line VIL may be disposed on the right side of the auxiliary gate line BGL. A third connection electrode CE3 of the second metal layer MTL2 may electrically connect the initialization voltage line VIL to a source electrode SE3 of the third transistor ST3 of the first pixel SP1 through a fifth contact hole CNT5. An eighth connection electrode CE8 of the second metal layer MTL2 may electrically connect the initialization voltage line VIL to the source electrode SE3 of the third transistor ST3 of the second pixel SP2 through a tenth contact hole CNT10. The eighth connection electrode CE8 may electrically connect the initialization voltage line VIL to the source electrode SE3 of the third transistor ST3 of the third pixel SP3 through the tenth contact hole CNT10. The source electrode SE3 of the third transistor ST3 of the second pixel SP2 and the source electrode SE3 of the third transistor ST3 of the third pixel SP3 may be integrally formed, but are not limited thereto. Accordingly, the initialization voltage line VIL may supply the initialization voltage to the third transistor ST3 of each of the first to third pixels SP1, SP2 and SP3 and receive the sensing signal from the third transistor ST3.

The vertical gate lines VGL may be disposed on the first metal layer MTL1. The vertical gate lines VGL may be disposed on the left side of the first voltage line VDL. The vertical gate line VGL may be connected to the horizontal gate line HGL of the second metal layer MTL2 through the contact portion MDC. The vertical gate line VGL may supply a gate signal to the horizontal gate line HGL. The vertical gate line VGL may overlap an auxiliary electrode AUE of the second metal layer MTL2 in the thickness direction (Z-axis direction), and may be connected to the auxiliary electrode AUE through the twenty-seventh contact holes CNT27. Accordingly, the vertical gate line VGL may reduce line resistance by being connected to the auxiliary electrode AUE.

The horizontal gate line HGL may be disposed on the second metal layer MTL2. The horizontal gate line HGL may be disposed on the upper side of the pixel circuit of the first pixel SP1. The horizontal gate line HGL may be connected to the vertical gate line VGL disposed on the first metal layer MTL1 through the contact portion MDC. The horizontal gate line HGL may supply a gate signal received from the vertical gate line VGL to the auxiliary gate line BGL.

The auxiliary gate line BGL may be disposed on the second metal layer MTL2. The auxiliary gate line BGL may protrude from the horizontal gate line HGL in the opposite direction of the second direction (Y-axis direction). The auxiliary gate line BGL may be integrally formed with the horizontal gate line HGL, but is not limited thereto. The auxiliary gate line BGL may be disposed on the right side of the pixel circuits of the first to third pixels SP1, SP2 and SP3. The auxiliary gate line BGL may supply the gate signal received from the horizontal gate line HGL to the second and third transistors ST2 and ST3 of each of the first to third pixels SP1, SP2, and SP3.

The first data line DL1 may be disposed on the first metal layer MTL1. The first data line DL1 may be disposed on the right side of the initialization voltage line VIL. The second connection electrode CE2 of the second metal layer MTL2 may electrically connect the first data line DL1 to the drain electrode DE2 of the second transistor ST2 of the first pixel SP1 through a fourth contact hole CNT4. The first data line DL1 may supply a data voltage to the second transistor ST2 of the first pixel SP1.

The second data line DL2 may be disposed on the first metal layer MTL1. The second data line DL2 may be disposed on the right side of the first data line DL1. A seventh connection electrode CE7 of the second metal layer MTL2 may electrically connect the second data line DL2 to the drain electrode DE2 of the second transistor ST2 of the second pixel SP2 through a ninth contact hole CNT9. The second data line DL2 may supply a data voltage to the second transistor ST2 of the second pixel SP2.

The third data line DL3 may be disposed on the first metal layer MTL1. The third data line DL3 may be disposed on the right side of the second gate line DL2. A twelfth connection electrode CE12 of the second metal layer MTL2 may electrically connect the third data line DL3 to the drain electrode DE2 of the second transistor ST2 of the third pixel SP3 through a fourteenth contact hole CNT14. The third data line DL3 may supply a data voltage to the second transistor ST2 of the third pixel SP3.

The vertical voltage line VVSL may be disposed on the first metal layer MTL1. The vertical voltage line VVSL may be disposed on the right side of the third data line DL3. The vertical voltage line VVSL may be connected to the second voltage line VSL of the second metal layer MTL2 through a twenty-sixth contact hole CNT26. The vertical voltage line VVSL may supply a low potential voltage to the second voltage line VSL.

The second voltage line VSL may be disposed on the second metal layer MTL2. The second voltage line VSL may be disposed on the lower side of the pixel circuit of the second pixel SP2. The second voltage line VSL may supply the low potential voltage received from the vertical voltage line VVSL to the third electrode of each of the first to third pixels SP1, SP2, and SP3. For example, the second voltage line VSL may be connected to the third electrode of the first pixel SP1 through a twenty-third contact hole CNT23. The second voltage line VSL may be connected to the third electrode of the second pixel SP2 through a twenty-fourth contact hole CNT24. The second voltage line VSL may be connected to a third electrode RME3 of the third pixel SP3 through a twenty-fifth contact hole CNT25. Here, the third electrode of each of the first to third pixels SP1, SP2, and SP3 may be disposed on the third electrode layer, and the twenty-third to twenty-fifth contact holes CNT23, CNT24, and CNT25 may be formed to penetrate a via layer VIA. The via layer VIA may be disposed on the second metal layer MTL2 and the gate insulating layer GI.

The pixel circuit of the first pixel SP1 may include first to third transistors ST1, ST2 and ST3. The first transistor ST1 of the first pixel SP1 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be disposed on the second metal layer MTL2. The gate electrode GE1 of the first transistor ST1 may be a part of the first connection electrode CE1. The first connection electrode CE1 may be connected to a first capacitor electrode CPE1 of the first capacitor C1 disposed in the active layer ACTL through a third contact hole CNT3. The first capacitor electrode CPE1 of the first capacitor C1 may be made conductive by heat-treating the active layer ACTL. The first capacitor electrode CPE1 of the first capacitor C1 may be integrally formed with the source electrode SE2 of the second transistor ST2, but is not limited thereto.

The drain electrode DE1 and the source electrode SE1 of the first transistor ST1 may be made conductive by heat treatment of the active layer ACTL. The fifteenth connection electrode CE15 may electrically connect the first voltage line VDL to the drain electrode DE1 of the first transistor ST1 through the first contact hole CNT1. The drain electrode DE1 of the first transistor ST1 may receive the driving voltage from the first voltage line VDL.

A fourth connection electrode CE4 of the second metal layer MTL2 may electrically connect the source electrode SE1 of the first transistor ST1, the drain electrode DE3 of the third transistor ST3, and a second capacitor electrode CPE2 of the first metal layer MTL1 through the second contact hole CNT2. The first capacitor C1 may be formed between the first capacitor electrode CPE1 of the active layer ACTL and the second capacitor electrode CPE2 of the first metal layer MTL1.

A fifth connection electrode CE5 of the second metal layer MTL2 may be connected to the second capacitor electrode CPE2 through a sixteenth contact hole CNT16. The fifth connection electrode CE5 may be connected to the first electrode of the first pixel SP1 through a seventeenth contact hole CNT17. Here, the first electrode of the first pixel SP1 may be disposed on the third electrode layer, and the seventeenth contact hole CNT17 may be formed to penetrate the via layer VIA.

The second transistor ST2 of the first pixel SP1 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed on the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the first data line DL1 through the second connection electrode CE2. The drain electrode DE2 of the second transistor ST2 may receive the data voltage of the first pixel SP1 from the first data line DL1.

The source electrode SE2 of the second transistor ST2 may be integrally formed with the first capacitor electrode CPE1 of the first capacitor C1. The source electrode SE2 of the second transistor ST2 may be electrically connected to the gate electrode GE1 of the first transistor ST1 through the first capacitor electrode CPE1 and the first connection electrode CE1.

The third transistor ST3 of the first pixel SP1 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed on the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be connected to the source electrode SE1 and the second capacitor electrode CPE2 of the first transistor ST1 through the fourth connection electrode CE4.

The source electrode SE3 of the third transistor ST3 may be electrically connected to the initialization voltage line VIL through the third connection electrode CE3. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction).

The gate electrode GE1 of the first transistor ST1 may be disposed on the second metal layer MTL2. The gate electrode GE1 of the first transistor ST1 may be a portion of a sixth connection electrode CE6. The sixth connection electrode CE6 may be connected to the first capacitor electrode CPE1 of the first capacitor C1 disposed in the active layer ACTL through an eighth contact hole CNT8. The first capacitor electrode CPE1 of the first capacitor C1 may be made conductive by heat-treating the active layer ACTL. The first capacitor electrode CPE1 of the first capacitor C1 may be integrally formed with the source electrode SE2 of the second transistor ST2, but is not limited thereto.

The drain electrode DE1 and the source electrode SE1 of the first transistor ST1 may be made conductive by heat treatment of the active layer ACTL. The fifteenth connection electrode CE15 may electrically connect the first voltage line VDL to the drain electrode DE1 of the first transistor ST1 through the sixth contact hole CNT6. The drain electrode DE1 of the first transistor ST1 may receive the driving voltage from the first voltage line VDL.

A ninth connection electrode CE9 of the second metal layer MTL2 may electrically connect the source electrode SE1 of the first transistor ST1, the drain electrode DE3 of the third transistor ST3, and the second capacitor electrode CPE2 of the first metal layer MTL1 through a seventh contact hole CNT7. The first capacitor C1 may be formed between the first capacitor electrode CPE1 of the active layer ACTL and the second capacitor electrode CPE2 of the first metal layer MTL1.

The tenth connection electrode CE10 of the second metal layer MTL2 may be connected to the second capacitor electrode CPE2 through an eighteenth contact hole CNT18. The tenth connection electrode CE10 may be connected to the first electrode of the second pixel SP2 through a nineteenth contact hole CNT19. Here, the first electrode of the second pixel SP2 may be disposed on the third electrode layer, and the nineteenth contact hole CNT19 may be formed to penetrate the via layer VIA.

The second transistor ST2 of the second pixel SP2 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed on the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the second data line DL2 through the seventh connection electrode CE7. The drain electrode DE2 of the second transistor ST2 may receive the data voltage of the second pixel SP2 from the second data line DL2.

The source electrode SE2 of the second transistor ST2 may be integrally formed with the first capacitor electrode CPE1 of the first capacitor C1. The source electrode SE2 of the second transistor ST2 may be electrically connected to the gate electrode GE1 of the first transistor ST1 through the first capacitor electrode CPE1 and the sixth connection electrode CE6.

The third transistor ST3 of the second pixel SP2 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed on the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be connected to the source electrode SE1 and the second capacitor electrode CPE2 of the first transistor ST1 through the ninth connection electrode CE9.

The source electrode SE3 of the third transistor ST3 may be electrically connected to the initialization voltage line VIL through the eighth connection electrode CE8. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the third pixel SP3 may include first to third transistors ST1, ST2 and ST3. The first transistor ST1 of the third pixel SP3 may include an active region ACT1, a gate electrode GE1, a drain electrode DE1, and a source electrode SE1. The active region ACT1 of the first transistor ST1 may be disposed on the active layer ACTL and may overlap the gate electrode GE1 of the first transistor ST1 in the thickness direction (Z-axis direction).

The gate electrode GE1 of the first transistor ST1 may be disposed on the second metal layer MTL2. The gate electrode GE1 of the first transistor ST1 may be a part of an eleventh connection electrode CE11. The eleventh connection electrode CE11 may be connected to the first capacitor electrode CPE1 of the first capacitor C1 disposed in the active layer ACTL through a thirteenth contact hole CNT13. The first capacitor electrode CPE1 of the first capacitor C1 may be made conductive by heat-treating the active layer ACTL. The first capacitor electrode CPE1 of the first capacitor C1 may be integrally formed with the source electrode SE2 of the second transistor ST2, but is not limited thereto.

The drain electrode DE1 and the source electrode SE1 of the first transistor ST1 may be made conductive by heat treatment of the active layer ACTL. The fifteenth connection electrode CE15 may electrically connect the first voltage line VDL to the drain electrode DE1 of the first transistor ST1 through the eleventh contact hole CNT11. The drain electrode DE1 of the first transistor ST1 may receive the driving voltage from the first voltage line VDL.

A thirteenth connection electrode CE13 of the second metal layer MTL2 may electrically connect the source electrode SE1 of the first transistor ST1, the drain electrode DE3 of the third transistor ST3, and the second capacitor electrode CPE2 of the first metal layer MTL1 through a twelfth contact hole CNT12. The first capacitor C1 may be formed between the first capacitor electrode CPE1 of the active layer ACTL and the second capacitor electrode CPE2 of the first metal layer MTL1.

The fourteenth connection electrode CE14 of the second metal layer MTL2 may be connected to the second capacitor electrode CPE2 through a twentieth contact hole CNT20. The fourteenth connection electrode CE14 may be connected to the first electrode of the third pixel SP3 through a twenty-first contact hole CNT21. Here, the first electrode of the third pixel SP3 may be disposed on the third electrode layer, and the twenty-first contact hole CNT21 may be formed to penetrate the via layer VIA.

The second transistor ST2 of the third pixel SP3 may include an active region ACT2, a gate electrode GE2, a drain electrode DE2, and a source electrode SE2. The active region ACT2 of the second transistor ST2 may be disposed on the active layer ACTL and may overlap the gate electrode GE2 of the second transistor ST2 in the thickness direction (Z-axis direction).

The gate electrode GE2 of the second transistor ST2 may be disposed on the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the third data line DL3 through the twelfth connection electrode CE12. The drain electrode DE2 of the second transistor ST2 may receive the data voltage of the third pixel SP3 from the third data line DL3.

The source electrode SE2 of the second transistor ST2 may be integrally formed with the first capacitor electrode CPE1 of the first capacitor C1. The source electrode SE2 of the second transistor ST2 may be electrically connected to the gate electrode GE1 of the first transistor ST1 through the first capacitor electrode CPE1 and the eleventh connection electrode CE11.

The third transistor ST3 of the third pixel SP3 may include an active region ACT3, a gate electrode GE3, a drain electrode DE3, and a source electrode SE3. The active region ACT3 of the third transistor ST3 may be disposed on the active layer ACTL and may overlap the gate electrode GE3 of the third transistor ST3 in the thickness direction (Z-axis direction).

The gate electrode GE3 of the third transistor ST3 may be disposed on the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be connected to the source electrode SE1 and the second capacitor electrode CPE2 of the first transistor ST1 through the thirteenth connection electrode CE13.

The source electrode SE3 of the third transistor ST3 may be electrically connected to the initialization voltage line VIL through the eighth connection electrode CE8. The source electrode SE3 of the third transistor ST3 may receive the initialization voltage from the initialization voltage line VIL. The source electrode SE3 of the third transistor ST3 may supply the sensing signal to the initialization voltage line VIL.

Figure 13:
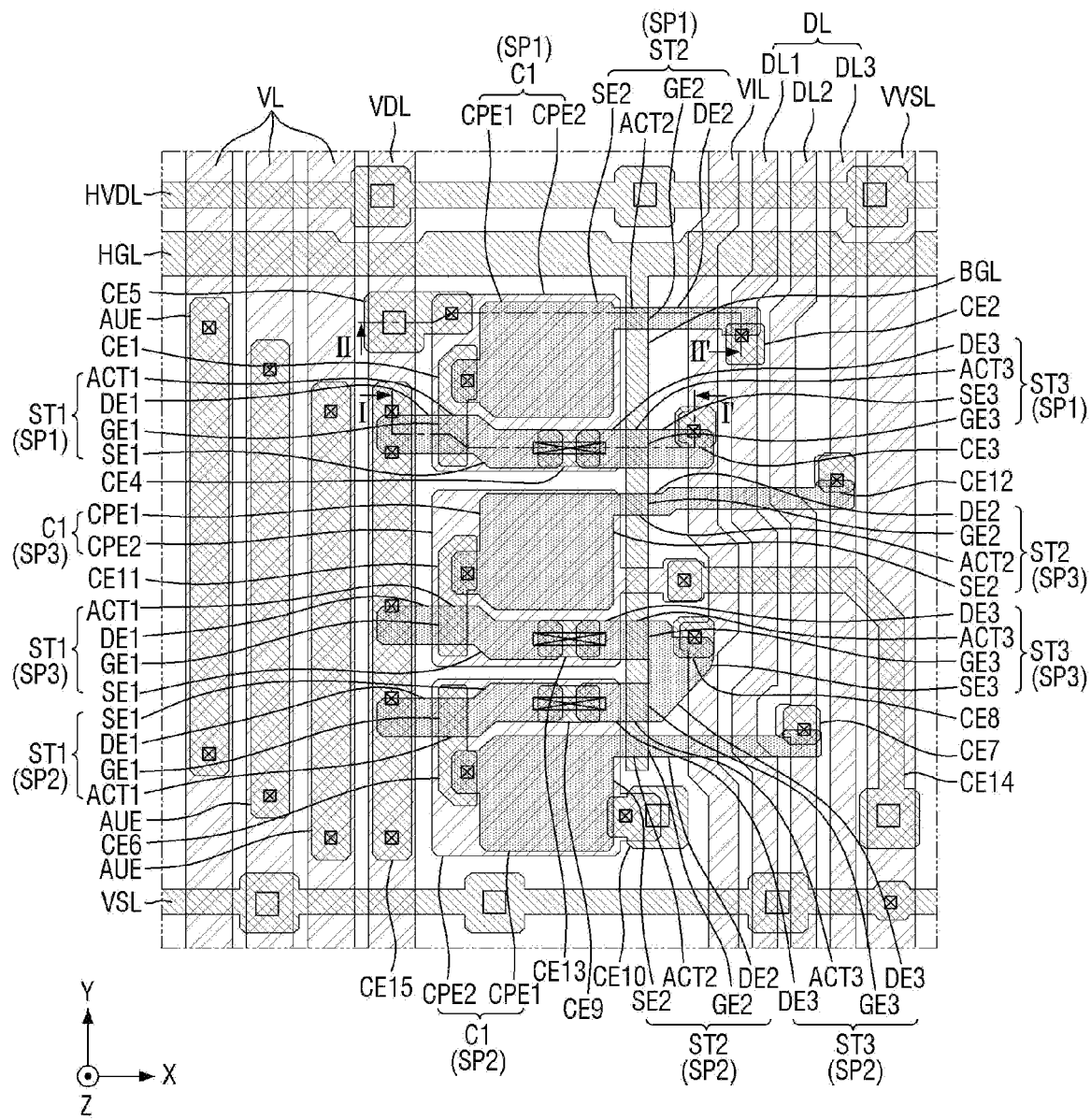
FIGS. 13 and 14 are schematic plan views illustrating a part of a power area in a display device according to an embodiment.
Figure 14:
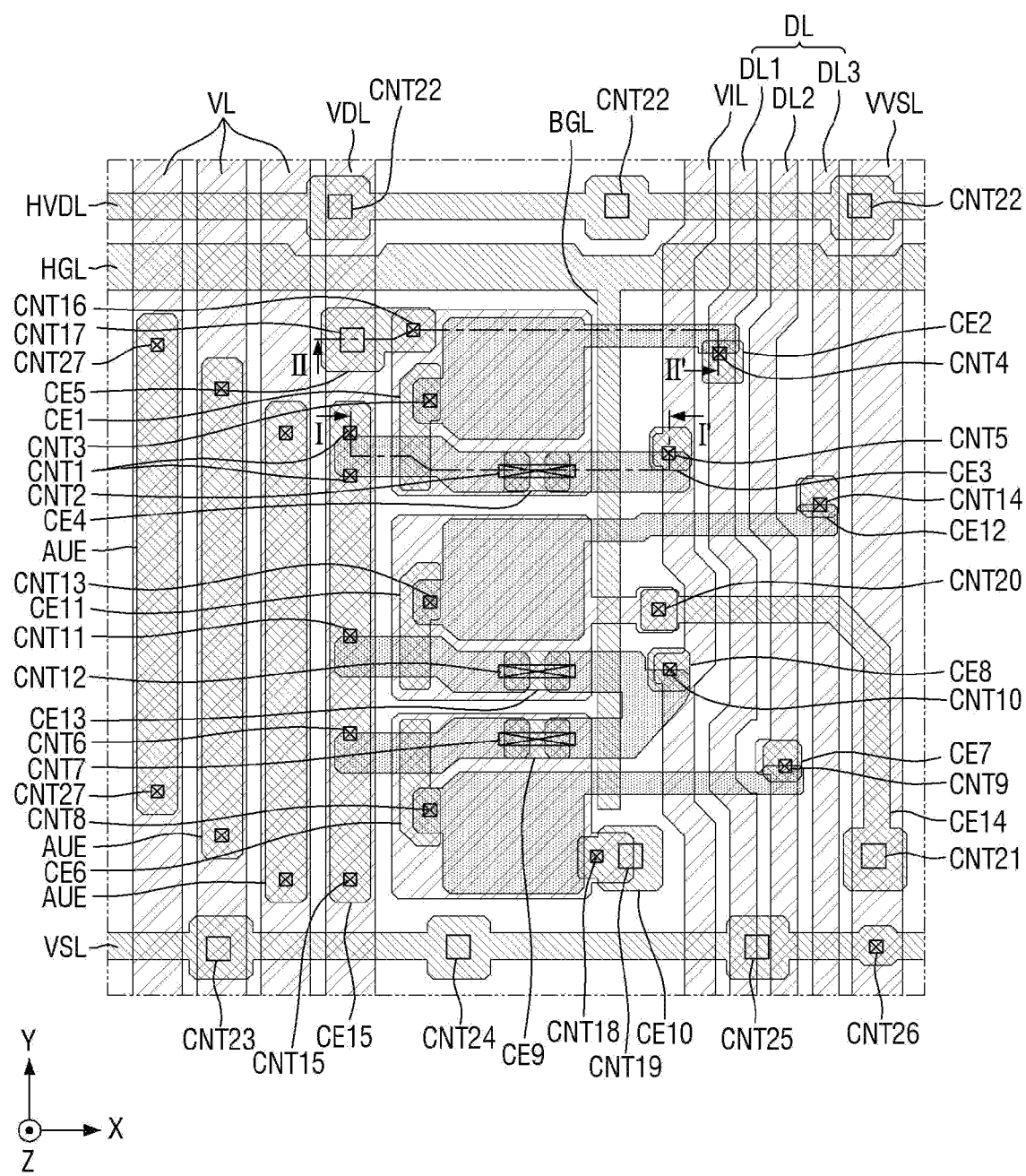

FIGS. 13 and 14 are schematic plan views illustrating a part of a power area in a display device according to an embodiment. The display device of FIGS. 13 and 14 may have a different configuration of the power line VL from the display device of FIGS. 9 and 10, and the same configuration as the aforementioned configuration will be briefly described or omitted.

Referring to FIGS. 13 and 14, the power lines VL may be disposed on the first metal layer MTL1. The power lines VL may be disposed on the left side of the first voltage line VDL. The power line VL may supply a driving voltage, a high potential voltage, a low potential voltage, or an off voltage to the power area PDA. The power line VL may overlap the auxiliary electrode AUE of the second metal layer MTL2 in the thickness direction (Z-axis direction), and may be connected to the auxiliary electrode AUE through the twenty-seventh contact holes CNT27. Accordingly, the power line VL may reduce line resistance by being connected to the auxiliary electrode AUE.

Figure 15:
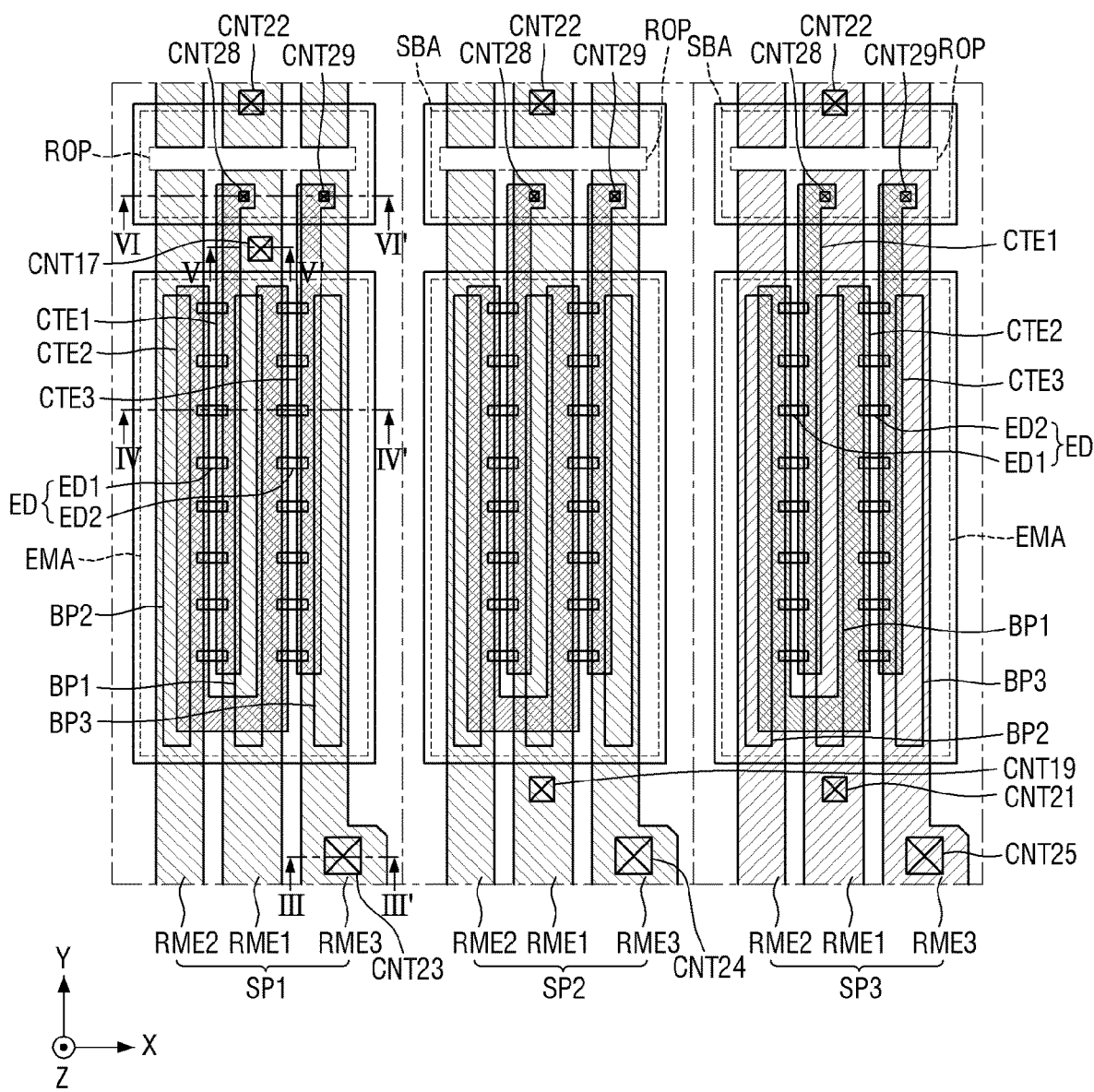
FIG. 15 is a schematic plan view illustrating a light emitting element layer of a display device according to an embodiment.
Figure 16:
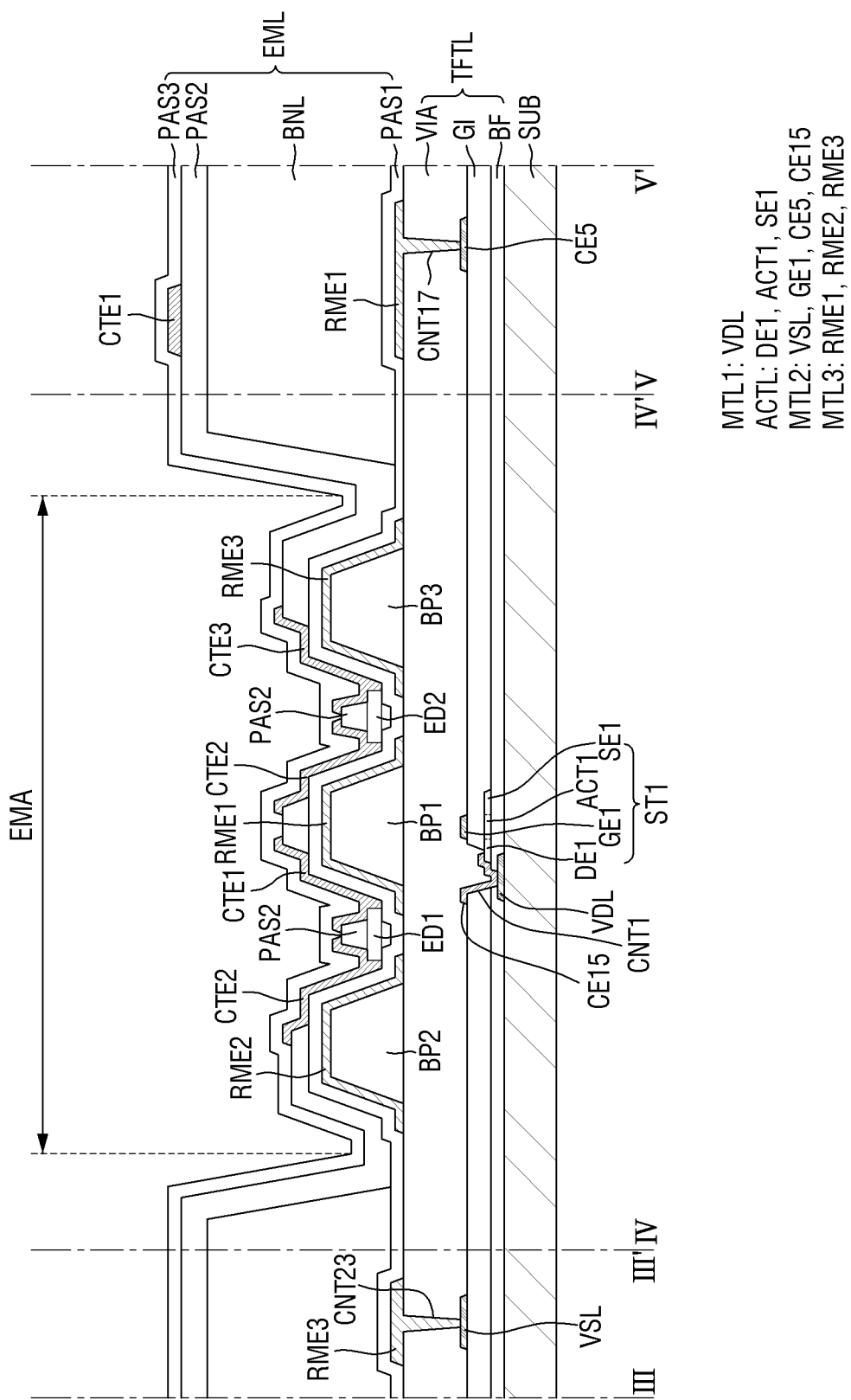
FIG. 16 is a schematic cross-sectional view taken along lines III-III', IV-IV', and V-V' of FIG. 15.
Figure 17:
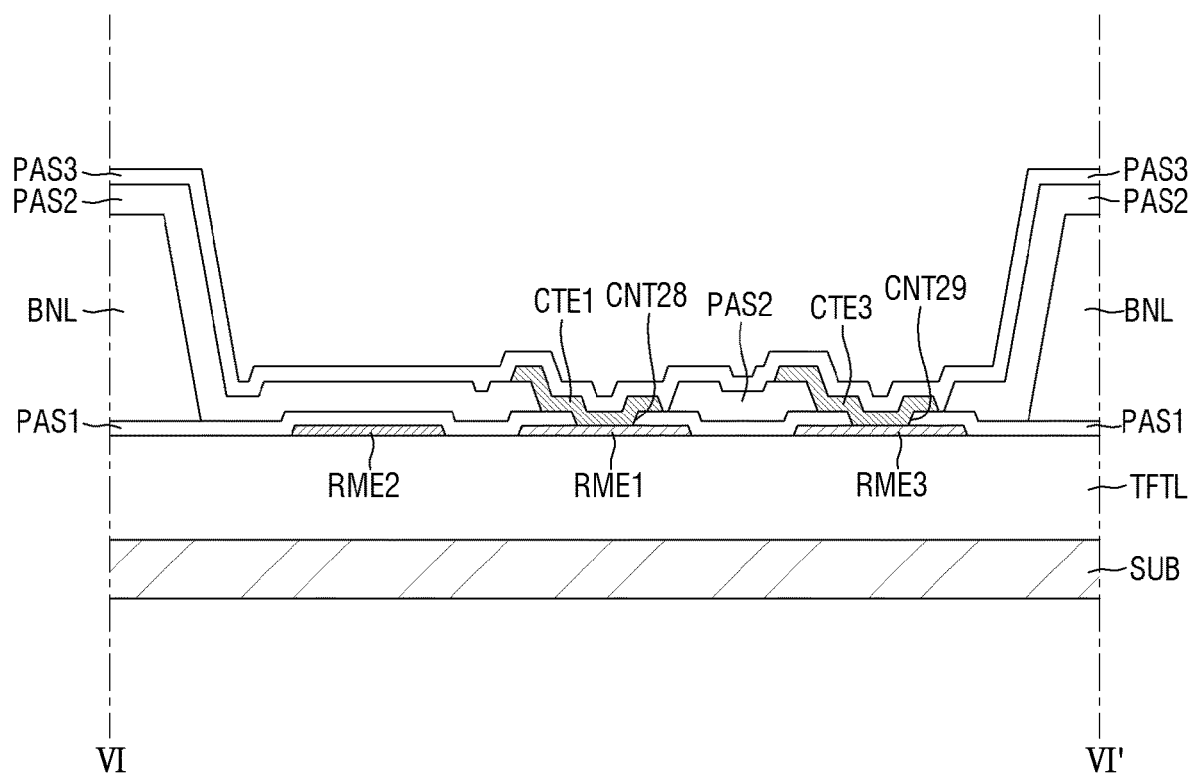
FIG. 17 is a schematic cross-sectional view taken along the line VI-VI' of FIG. 15.

FIG. 15 is a schematic plan view illustrating a light emitting element layer of a display device according to an embodiment, FIG. 16 is a schematic cross-sectional view taken along lines III-III', IV-IV', and V-V' of FIG. 15, and FIG. 17 is a schematic cross-sectional view taken along the line VI-VI' of FIG. 15.

Referring to FIGS. 15 to 17, the light emitting element layer EML of the display device 10 may be disposed on the thin film transistor layer TFTL. The light emitting element layer EML may include first to third bank patterns BP1, BP2, and BP3, first to third electrodes RME1, RME2, and RME3, the first and second light emitting elements ED1 and ED2, a first insulating layer PAS1, a bank layer BNL, a second insulating layer PAS2, first to third contact electrodes CTE1, CTE2, and CTE3, and a third insulating layer PAS3.

The first bank pattern BP1 may be disposed in the center of an emission area EMA, the second bank pattern BP2 may be disposed on the left side of the emission area EMA, and the third bank pattern BP3 may be disposed on the right side of the emission area EMA. Each of the first to third bank patterns BP1, BP2, and BP3 may protrude in the upward direction (Z-axis direction) on a via layer VIA. Each of the first to third bank patterns BP1, BP2, and BP3 may have an inclined side surface. The first light emitting elements ED1 may be disposed between the first and second bank patterns BP1 and BP2 spaced apart from each other, and the second light emitting elements ED2 may be disposed between the second and third bank patterns BP2 and BP3 spaced apart from each other. The first to third bank patterns BP1, BP2, and BP3 may have the same length in the second direction (Y-axis direction) and different lengths in the first direction (X-axis direction), but are not limited thereto. The first to third bank patterns BP1, BP2, and BP3 may be disposed in island-like patterns on the entire surface of the display area DA.

The first to third electrodes RME1, RME2, and RME3 of each of the first to third pixels SP1, SP2, and SP3 may be disposed on the third electrode layer MTL3. The third electrode layer MTL3 may be disposed on the via layer VIA and the first to third bank patterns BP1, BP2, and BP3. The first electrode RME1 may extend in the second direction (Y-axis direction) from the center of the emission area EMA. The first electrode RME1 may cover a top surface and an inclined side surface of the first bank pattern BP1. Accordingly, the first electrode RME1 may reflect the light emitted from the first and second light emitting elements ED1 and ED2 in the upward direction (Z-axis direction).

The second electrode RME2 may extend in the second direction (Y-axis direction) from the left side of the emission area EMA. The second electrode RME2 may cover a top surface and an inclined side surface of the second bank pattern BP2. Accordingly, the second electrode RME1 may reflect the light emitted from the first light emitting element ED1 in the upward direction (Z-axis direction).

The third electrode RME3 may extend in the second direction (Y-axis direction) from the right side of the emission area EMA. The third electrode RME3 may cover the top surface and the inclined side surface of the third bank pattern BP3. Accordingly, the third electrode RME3 may reflect the light emitted from the second light emitting element ED2 in the upward direction (Z-axis direction).

An end of the first to third electrodes RME1, RME2, and RME3 may be separated on a row basis by the separation portion ROP. The first to third electrodes RME1, RME2, and RME3 may be alignment electrodes that align the first and second light emitting elements ED1 and ED2 during the manufacturing process of the display device 10. The first electrode RME1 before separation may be connected to the horizontal voltage line HVDL of the second metal layer MTL2 through a twenty-second contact hole CNT22, and may receive a driving voltage or a high potential voltage to function as the alignment electrode. Accordingly, the first to third electrodes RME1, RME2, and RME3 may be separated by the separation portion ROP after the alignment process of the plurality of light emitting elements ED may be completed.

The first electrode RME1 of the first pixel SP1 may be connected to the fifth connection electrode CE5 of the second metal layer MTL2 through the seventeenth contact hole CNT17. The first electrode RME1 may receive the driving current having passed through the first transistor ST1 from the fifth connection electrode CE5. The first electrode RME1 may supply a driving current to the first light emitting elements ED1 of the first pixel SP1 through the first contact electrode CTE1.

The third electrode RME3 of the first pixel SP1 may be connected to the second voltage line VSL of the second metal layer MTL2 through a twenty-third contact hole CNT23. Accordingly, the third electrode RME3 of the first pixel SP1 may receive a low potential voltage from the second voltage line VSL.

The first electrode RME1 of the second pixel SP2 may be connected to the tenth connection electrode CE10 of the second metal layer MTL2 through the nineteenth contact hole CNT19. The first electrode RME1 may receive the driving current having passed through the first transistor ST1 from the tenth connection electrode CE10. The first electrode RME1 may supply a driving current to the plurality of first light emitting elements ED1 of the second pixel SP2 through the first contact electrode CTE1.

The third electrode RME3 of the second pixel SP2 may be connected to the second voltage line VSL of the second metal layer MTL2 through a twenty-fourth contact hole CNT24. Accordingly, the third electrode RME3 of the second pixel SP2 may receive a low potential voltage from the second voltage line VSL.

The first electrode RME1 of the third pixel SP3 may be connected to the fourteenth connection electrode CE14 of the second metal layer MTL2 through the twenty-first contact hole CNT21. The first electrode RME1 may receive the driving current having passed through the first transistor ST1 from the fourteenth connection electrode CE14. The first electrode RME1 may supply a driving current to the first light emitting elements ED1 of the third pixel SP3 through the first contact electrode CTE1.

The third electrode RME3 of the third pixel SP3 may be connected to the second voltage line VSL of the second metal layer MTL2 through a twenty-fifth contact hole CNT25. Accordingly, the third electrode RME3 of the third pixel SP3 may receive a low potential voltage from the second voltage line VSL.

Multiple first light emitting elements ED1 may be aligned between the first electrode RME1 and the second electrode RME2. The first insulating layer PAS1 may cover the first to third electrodes RME1, RME2, and RME3. The first light emitting elements ED1 may be insulated from the first and second electrodes RME1 and RME2 by the first insulating layer PAS1. Before the first and second electrode RME1 and RME2 may be separated by the separation portion ROP, each of the first and second electrodes RME1 and RME2 may receive the alignment signal, and the electric field may be formed between the first and second electrodes RME1 and RME2. For example, the first light emitting elements ED1 may be sprayed on the first and second electrodes RME1 and RME2 through an inkjet printing process, and the first light emitting elements ED1 dispersed in ink may be aligned by a dielectrophoretic force due to the electric field formed between the first and second electrodes RME1 and RME2. Accordingly, the first light emitting elements ED1 may be aligned in the second direction (Y-axis direction) between the first and second electrodes RME1 and RME2.

Multiple second light emitting elements ED2 may be aligned between the first electrode RME1 and the third electrode RME3. The second light emitting elements ED2 may be insulated from the first and third electrodes RME1 and RME3 by the first insulating layer PAS1. Before the first and third electrode RME1 and RME3 may be separated by the separation portion ROP, each of the first and third electrode RME1 and RME3 may receive the alignment signal, and the electric field may be formed between the first and third electrode RME1 and RME3. For example, the second light emitting elements ED2 may be sprayed on the first and third electrodes RME1 and RME3 through the inkjet printing process, and the plurality of second light emitting elements ED2 sprayed in ink may be aligned by receiving a dielectrophoretic force by the electric field formed between the first and third electrodes RME1 and RME3. Accordingly, the second light emitting elements ED2 may be aligned in the second direction (Y-axis direction) between the first and third electrodes RME1 and RME3.

The first to third contact electrodes CTE1, CTE2, and CTE3 of each of the first to third pixels SP1, SP2, and SP3 may be disposed on the first to third electrodes RME1, RME2, and RME3. The second insulating layer PAS2 may be disposed on the bank layer BNL, the first insulating layer PAS1, and the central portions of the light emitting elements ED. The third insulating layer PAS3 may cover the second insulating layer PAS2 and the first to third contact electrodes CTE1, CTE2, and CTE3. The second and third insulating layers PAS2 and PAS3 may insulate each of the first to third contact electrodes CTE1, CTE2, and CTE3.

The first contact electrode CTE1 may be disposed on the first electrode RME1, and connected to the first electrode RME1 through a twenty-eighth contact hole CNT28. The first contact electrode CTE1 may be connected between the first electrode RME1 and ends of the first light emitting elements ED1. The first contact electrode CTE1 may correspond to an anode electrode of the first light emitting elements ED1, but the disclosure is not limited thereto.

The second contact electrode CTE2 may be disposed on the first and second electrodes RME1 and RME2, and be insulated from the first and second electrodes RME1 and RME2. The first portion of the second contact electrode CTE2 may be disposed on the second electrode RME2, and extend in the second direction (Y-axis direction). The second portion of the second contact electrode CTE2 may be bent from the lower side of the first portion thereof to extend in the first direction (X-axis direction). The third portion of the second contact electrode CTE2 may be bent from the right side of the second portion thereof to extend in the second direction (Y-axis direction) and may be disposed on the first electrode RME1.

The second contact electrode CTE2 may be connected between other ends of the first light emitting elements ED1 and ends of the plurality of second light emitting elements ED2. The second contact electrode CTE2 may correspond to the third node N3 of FIG. 8. The second contact electrode CTE2 may correspond to a cathode electrode of the first light emitting elements ED1, but is not limited thereto. The second contact electrode CTE2 may correspond to an anode electrode of the second light emitting elements ED2, but is not limited thereto.

The third contact electrode CTE3 may be disposed on the third electrode RME3, and may be connected to the third electrode RME3 through a twenty-ninth contact hole CNT29. The third contact electrode CTE3 may be connected between other ends of the second light emitting elements ED2 and the third electrode RME3. The third contact electrode CTE3 may correspond to a cathode electrode of the second light emitting elements ED2, but is not limited thereto. The third contact electrode CTE3 may receive the low potential voltage through the third electrode RME3.

The first transistor ST1 of the thin film transistor layer TFTL may include the active region ACT1, the gate electrode GE1, the drain electrode DE1, and the source electrode SE1. The drain electrode DE1 of the first transistor ST1 may receive a driving voltage from the first voltage line VDL of the first electrode layer MTL1 through the fifteenth connection electrode CE15.

Figure 18:
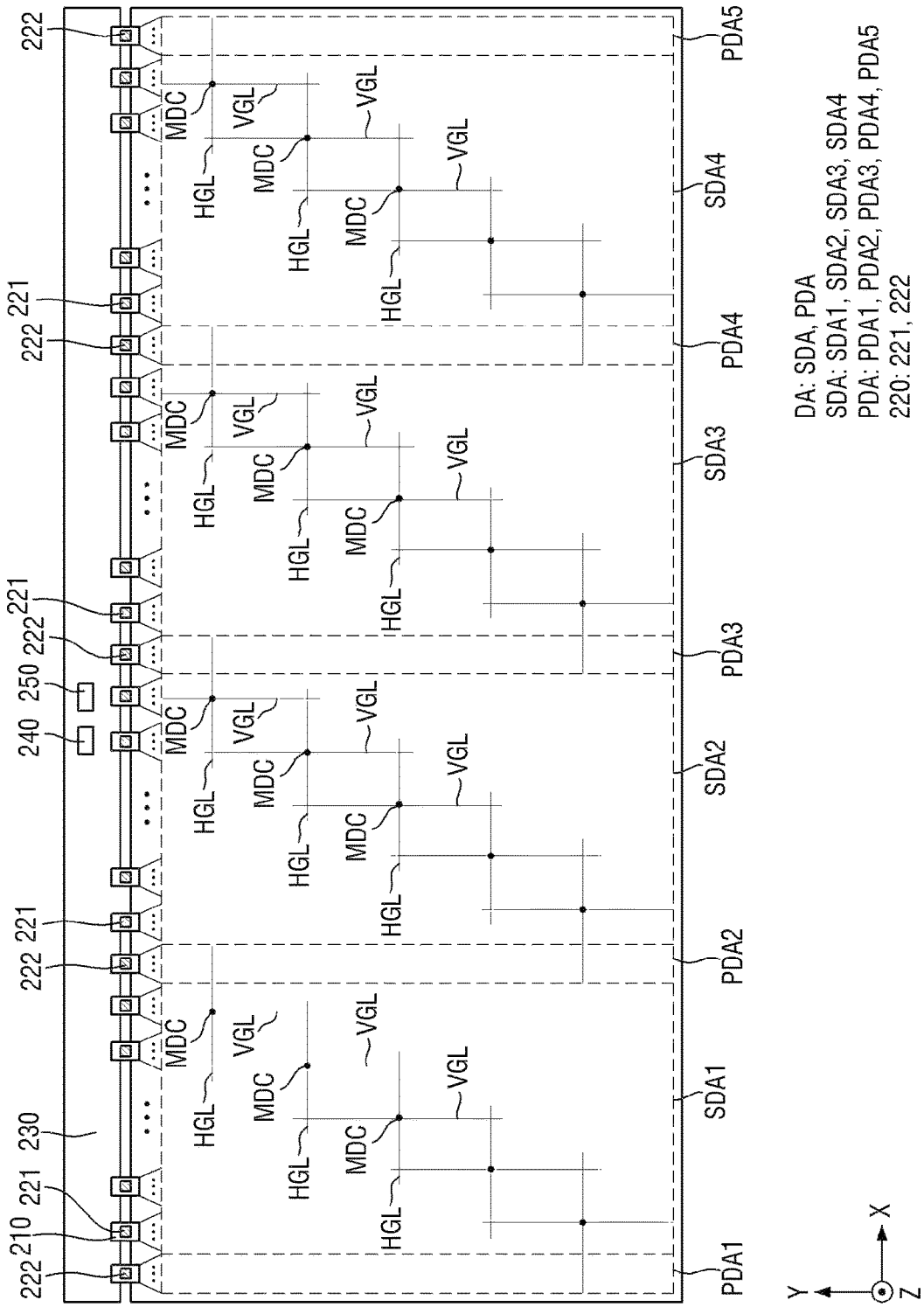
FIG. 18 is a schematic plan view illustrating a scan area and a power area in a display device according to another embodiment.
Figure 19:
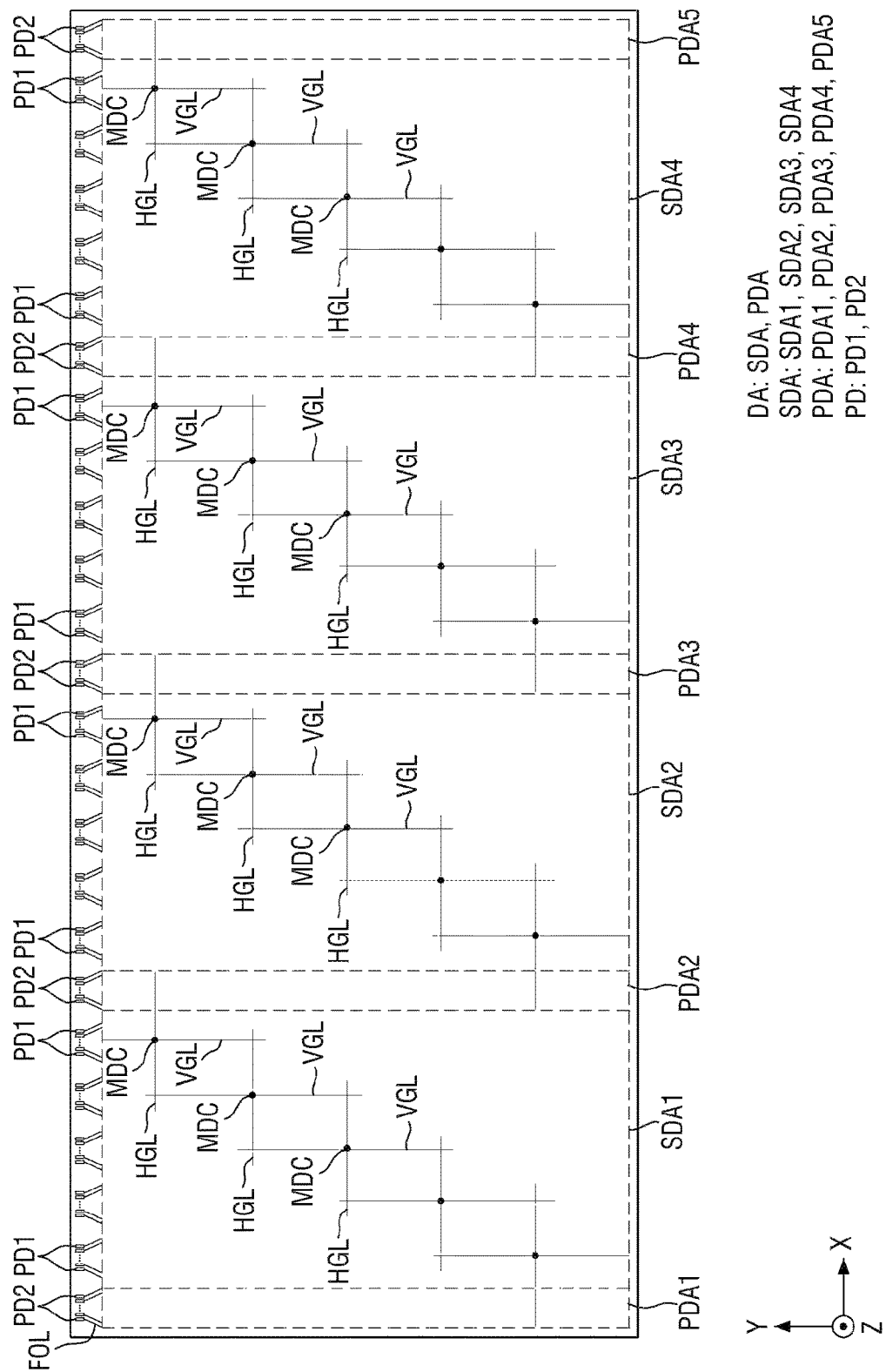
FIG. 19 is a schematic plan view illustrating first and second pad parts in a display device according to another embodiment.

FIG. 18 is a schematic plan view illustrating a scan area and a power area in a display device according to another embodiment, and FIG. 19 is a schematic plan view illustrating first and second pad parts in a display device according to another embodiment.

Referring to FIGS. 18 and 19, the display panel 100 may include the display area DA and the non-display area NDA. The display area DA may include the scan area SDA and the power area PDA. The scan area SDA and the power area PDA may be alternately disposed in the first direction (X-axis direction).

The scan area SDA may include the first to fourth scan areas SDA1, SDA2, SDA3, and SDA4. The first scan area SDA1 may be disposed between the first and second power areas PDA1 and PDA2. The second scan area SDA2 may be disposed between the second and third power areas PDA2 and PDA3. The third scan area SDA3 may be disposed between the third and fourth power areas PDA3 and PDA4. The fourth scan area SDA4 may be disposed between the fourth and fifth power areas PDA4 and PDA5. Each of the first to fourth scan areas SDA1, SDA2, SDA3, and SDA4 may correspond to the first pad part PD1. Each of the first to fourth scan areas SDA1, SDA2, SDA3, and SDA4 may include the vertical gate line VGL and the horizontal gate line HGL.

The vertical gate line VGL may be electrically connected to the first pad part PD1 through the fan-out line FOL. The vertical gate lines VGL may cross the horizontal gate lines HGL. For example, a vertical gate line VGL may be connected to one of the horizontal gate lines HGL through a contact portion MDC. A vertical gate line VGL may be insulated from other horizontal gate lines HGL. Accordingly, the vertical gate line VGL and the horizontal gate line HGL may be insulated from each other at crossing points except for the contact portion MDC.

The contact portion MDC of a first scan area SDA1 may be disposed on an extension line extending from the upper right end of the first scan area SDA1 to the lower left end of the first scan area SDA1. The contact portion MDC of a second scan area SDA2 may be disposed on an extension line extending from the upper right end of the second scan area SDA2 to the lower left end of the second scan area SDA2. The contact portion MDC of a third scan area SDA3 may be disposed on an extension line extending from the upper right end of the third scan area SDA3 to the lower left end of the third scan area SDA3. The contact portion MDC of a fourth scan area SDA4 may be disposed on an extension line extending from the upper right end of the fourth scan area SDA4 to the lower left end of the fourth scan area SDA4. Accordingly, the contact portions MDC may be arranged along a diagonal direction between the first direction (X-axis direction) and the second direction (Y-axis direction) in each of the first to fourth scan areas SDA1, SDA2, SDA3, and SDA4.

The power area PDA may include the first to fifth power areas PDA1, PDA2, PDA3, PDA4, and PDA5. The first power area PDA1 may be disposed on the left side of the first scan area SDA1, and may be disposed at the left edge of the display area DA. The second power area PDA2 may be disposed between the first and second scan areas SDA1 and SDA2. The third power area PDA3 may be disposed between the second and third scan areas SDA2 and SDA3. The fourth power area PDA4 may be disposed between the third and fourth scan areas SDA3 and SDA4. The fifth power area PDA5 may be disposed on the right side of the fourth scan area SDA4, and may be disposed at the right edge of the display area DA. Each of the first to fifth power areas PDA1, PDA2, PDA3, PDA4, and PDA5 may correspond to the second pad part PD2. Each of the first to fifth power areas PDA1, PDA2, PDA3, PDA4, and PDA5 may include the horizontal gate line HGL.

The horizontal gate line HGL of the power area PDA may be electrically connected to the vertical gate line VGL of the scan area SDA. The horizontal gate line HGL of the first power area PDA1 may be electrically connected to the vertical gate line VGL of the first scan area SDA1. The horizontal gate line HGL of the second power area PDA2 may be electrically connected to the vertical gate line VGL of the first and second scan areas SDA1 and SDA2. The horizontal gate line HGL of the third power area PDA3 may be electrically connected to the vertical gate line VGL of the second and third scan areas SDA2 and SDA3. The horizontal gate line HGL of the fourth power area PDA4 may be electrically connected to the vertical gate line VGL of the third and fourth scan areas SDA3 and SDA4. The horizontal gate line HGL of the fifth power area PDA5 may be electrically connected to the vertical gate line VGL of the fourth scan area SDA4.

The display driver 220 may include the first display driver 221 and the second display driver 222. The first display driver 221 may be electrically connected to the first pad part PD1. The first display driver 221 may supply a gate signal to the vertical gate line VGL of the scan area SDA. The first display driver 221 may supply a data voltage to a data line of the scan area SDA and may supply a power voltage to a power line of the scan area SDA. Here, the power voltage may be a driving voltage, a high potential voltage, a low potential voltage, or an off voltage. Accordingly, the first display driver 221 may serve as a data driver and a gate driver.

The second display driver 222 may be electrically connected to the second pad part PD2. The second display driver 222 may supply a data voltage to the data line of the power area PDA, and may supply a power voltage to the power line of the power area PDA. Accordingly, the second display driver 222 may serve as a data driver.

Accordingly, since the data line DL receives a data voltage from the first and second display drivers 221 and 222 disposed on the upper side of the non-display area NDA, and the vertical gate line GL receives the gate signal from the first display driver 221 disposed on the upper side of the non-display area NDA, the display device 10 may minimize the sizes of the left side, right side, and lower side of the non-display area NDA.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A display device comprising:
a display panel including:
a display area having a scan area and a power area disposed on a side of the scan area; and
a non-display area surrounding the display area and being absent of any light emitting pixels, the non-display area having a pad part, wherein the pad part includes:
a first pad part including a plurality of line pad parts electrically connected one-to-one to lines of the scan area; and
a second pad part including a plurality of line pad parts electrically connected one-to-one to lines of the power area, and a power pad part electrically connected one-to-many to lines of the power area, wherein
the power area includes a plurality of pixels, a horizontal gate line electrically connected to a vertical gate line of the scan area.

2. The display device of claim 1, wherein
the scan area includes:
a vertical gate line electrically connected to the first pad part and extending in a first direction; and
a horizontal gate line electrically connected to the vertical gate line and extending in a second direction intersecting the first direction.

3. The display device of claim 2, wherein the power area is spaced apart from any vertical gate line.

4. The display device of claim 1, wherein
the power area includes a plurality of power lines extending in parallel in a first direction, and
a power pad part of the second pad part is electrically connected to the plurality of power lines.

5. The display device of claim 4, wherein the plurality of power lines electrically connected to the power pad part are electrically connected to each other.

6. The display device of claim 1, wherein
the scan area includes:
a first voltage line extending in a first direction to supply a high potential voltage; and
a vertical gate line disposed on a side of the first voltage line to supply a gate signal.

7. The display device of claim 6, wherein the power area includes:
a first voltage line extending in the first direction to supply a high potential voltage; and
a power line disposed on a side of the first voltage line to supply a power voltage.

8. The display device of claim 1, further comprising:
a first display driver electrically connected to the first pad part to supply a data voltage, a gate signal, and a power voltage to the scan area; and
a second display driver electrically connected to the second pad part to supply a data voltage and a power voltage to the power area.

9. The display device of claim 1, wherein
each of the plurality of line pad parts has a first width and are disposed to be spaced apart from each other by a first distance, and
the power pad part has a second width greater than the first width.

10. The display device of claim 9, wherein power supply efficiency of the power pad part designed in a same area is greater than power supply efficiency of the plurality of line pad parts.

11. The display device of claim 1, wherein
the scan area includes a plurality of scan areas disposed adjacent to each other, and
the power area includes a plurality of power areas disposed at edges of the display panel.

12. A display device comprising:
a display panel including:
  a display area having a scan area and a power area disposed on a side of the scan area; and
  a non-display area surrounding the display area and having a pad part, wherein the pad part includes:
    a first pad part including a plurality of line pad parts electrically connected one-to-one to lines of the scan area; and
    a second pad part including a plurality of line pad parts electrically connected one-to-one to lines of the power area, and a power pad part electrically connected one-to-many to lines of the power area, wherein
the power area includes a horizontal gate line electrically connected to a vertical gate line of the scan area,
the scan area includes a plurality of scan areas,
the power area includes a plurality of power areas, and
a part of the plurality of power areas is disposed between the plurality of scan areas.

13. The display device of claim 1, further comprising:
the power pad part of the second pad part is immediately adjacent to the plurality of line pad parts of the second pad part.

14. The display device of claim 1, wherein the horizontal gate line is electrically connected to one of the line pad parts of the first pad part by way of the vertical gate line.

15. The display device of claim 1, wherein the display area further comprises a plurality of light emitting pixels.

16. A display device comprising:
a display area including a plurality of pixels and having a scan area and a power area disposed on a side of the scan area; and
a non-display area surrounding the display area and having a pad part, wherein
the scan area includes:
  a first voltage line extending in a first direction on a side of the pixel to supply a high potential voltage; and
  a plurality of vertical gate lines disposed on a side of the first voltage line to supply a gate signal, and
the power area includes:
  a first voltage line extending in a first direction on a side of the pixel to supply a high potential voltage; and
  a plurality of power lines disposed on a side of the first voltage line to supply a power voltage, and
the pad part includes:
  a first pad part including a plurality of line pad parts electrically connected one-to-one to the first voltage line and the plurality of vertical gate lines; and
  a second pad part including one or more line pad parts electrically connected one-to-one to the first voltage line, and a power pad part electrically connected one-to-many to the plurality of power lines, and wherein
the power pad part of the second pad part is adjacent to the one or more line pad parts of the second pad part,
the one or more line pad parts of the second pad part each having a first width and disposed to be spaced apart each other by a first distance,
the power pad part of the second pad part having a second width greater than the first width, and
the second width of the power pad part of the second pad part is the sum of the first width of the one or more line pad parts of the second pad part and the first distance between the one or more line pad parts of the second pad part, wherein
the scan area includes a plurality of scan areas,
the power area includes a plurality of power areas, and
a part of the plurality of power areas is disposed between the plurality of scan areas.

17. The display device of claim 16, wherein
the scan area further includes a horizontal gate line electrically connected to the plurality of vertical gate lines and extending in a second direction intersecting the first direction, and
the power area further includes a horizontal gate line electrically connected to a plurality of vertical gate lines of the scan area.

18. The display device of claim 16, further comprising:
a first display driver electrically connected to the first pad part to supply a data voltage, a gate signal, and a power voltage to the scan area; and
a second display driver electrically connected to the second pad part to supply a data voltage and a power voltage to the power area.

19. The display device of claim 16, wherein power supply efficiency of the power pad part designed in a same area is greater than power supply efficiency of the plurality of line pad parts.

20. The display device of claim 16, wherein the plurality of power lines electrically connected to the power pad part are electrically connected to each other.

21. The display device of claim 16, wherein the plurality of power lines supplies at least one of a driving voltage, a high potential voltage, a low potential voltage, and an off voltage to the power area.

22. The display device of claim 16, wherein
the scan area includes a plurality of scan areas disposed adjacent to each other, and
the power area includes a plurality of power areas disposed at edges of the display panel.

* * * * *